(12) United States Patent
Beach et al.

(10) Patent No.: US 6,483,446 B1
(45) Date of Patent: Nov. 19, 2002

(54) VARIABLE-LENGTH MESSAGE FORMATS AND METHODS OF ASSEMBLING AND COMMUNICATING VARIABLE-LENGTH MESSAGES

(75) Inventors: Douglas J. Beach, Endicott, NY (US); Jeffrey Scott Poulin, Endicott, NY (US); Linda H. Rockwood, Endwell, NY (US); Richard C. Van Hall, Owego, NY (US); Joseph P. Zanovitch, Barton, NY (US)

(73) Assignee: Lockheed Martin Corporation, Bethesda, MD (US)

( * ) Notice: Subject to any disclaimer, the term of this patent is extended or adjusted under 35 U.S.C. 154(b) by 0 days.

(21) Appl. No.: 10/004,188

(22) Filed: Nov. 2, 2001

(51) Int. Cl.[7] .................................................. H03M 7/40
(52) U.S. Cl. ........................................... 341/67; 341/50
(58) Field of Search .............................. 341/63, 67, 65, 341/106, 99, 50

(56) References Cited

U.S. PATENT DOCUMENTS

| | | |
|---|---|---|
| 4,885,584 A | 12/1989 | Dalrymple |
| 5,283,900 A | 2/1994 | Frankel et al. |
| 5,386,482 A | 1/1995 | Basso et al. |
| 5,592,656 A | 1/1997 | Canzone |
| 6,339,386 B1 * | 1/2002 | Cho ............................ 341/67 |
| 6,411,229 B2 * | 7/2002 | Kobayashi ................... 341/67 |

* cited by examiner

*Primary Examiner*—Brian Young
(74) *Attorney, Agent, or Firm*—Louis J. Franco; Leland D. Schultz; Patrick M. Hogan

(57) ABSTRACT

A system for assembling and communicating variable-length data messages over a computer network is adapted to access a master set of predefined data structures and select for inclusion within an assembled message those predefined data structures within the master set meeting a predetermined set of inclusion criteria. A message is assembled to include a set of selected predefined structures and an index including a set of index references. Each index reference corresponds to a data structure within the message and is indicative of the content of the data structure to which it corresponds. An offset reference is associated with each index reference of a selected set of index references included in the index. An offset reference is indicative of the location within the assembled message of a predefined data structure corresponding to the index reference with which the offset references is associated.

32 Claims, 13 Drawing Sheets

Illustrative mail piece processing environment

FIG. 1  Illustrative mail piece processing environment

Mail Piece *(front side)*

Mail Piece *(rear side)*

| Query Code | Query |
|---|---|
| . . . . | . . . . |
| 0016 | Resolve first 3 digits of destination ZIP |
| 0017 | Resolve last 2 digits of destination 5-digit ZIP |
| 0018 | Resolve $6^{th}$ and $7^{th}$ digits of destination postal code |
| 0019 | Resolve $8^{th}$ and $9^{th}$ digits of destination postal code |
| 0020 | Resolve $10^{th}$ and $11^{th}$ digits of destination postal code for delivery seq. |
| 0021 | Resolve full five digit ZIP |
| 0022 | Resolve full five-digit plus 4 digits in postal code |
| 0023 | Resolve full eleven-digits in postal code |
| . . . | . . . . |
| 0027 | Resolve destination state name |
| 0028 | Resolve destination city name |
| 0029 | Resolve destination street name |
| 0030 | Resolve destination box number |
| 0031 | Resolve addressee surname |
| 0032 | Resolve addressee middle initial |
| 0033 | Resolve addressee first name |
| . . . | . . . |
| 0052 | Resolve affixed postage/stamp value |
| 0053 | Resolve mail class |
| . . . . | . . . |
| 0071 | Resolve first 3 digits return address ZIP |
| 0072 | Resolve full 5 digits return address ZIP |
| 0073 | Resolve return address state name |
| 0074 | Resolve return address city name |
| 0075 | Resolve return address street name |
| 0076 | Resolve return address box number |
| . . . | . . . . |

FIG. 5

Portion of an illustrative master query file 300

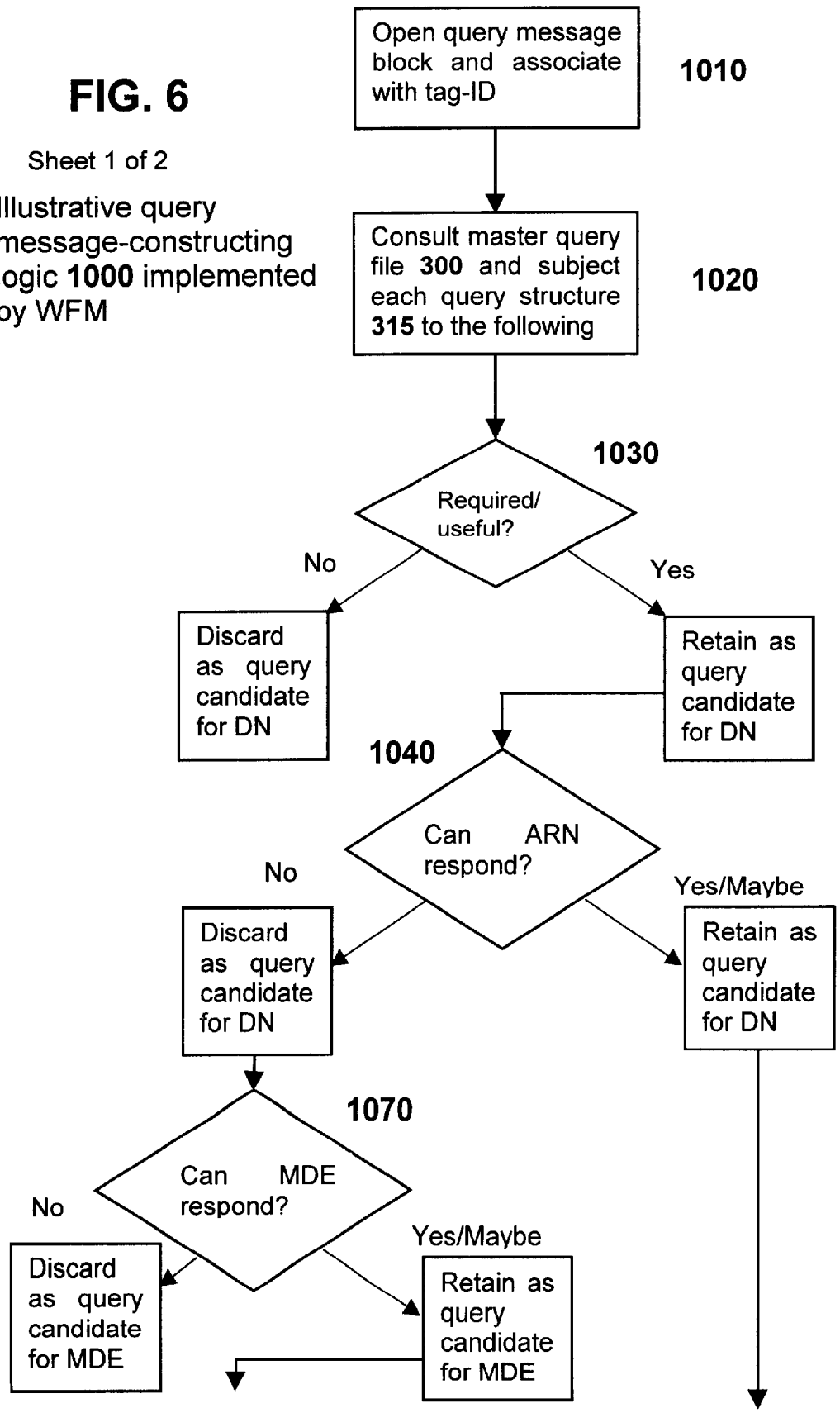

Illustrative portion of a master response-message file 400 showing an illustrative master response message 410 including severable data structures 420

Illustrative portion of an assembled indexed message 430 showing included data structures 455

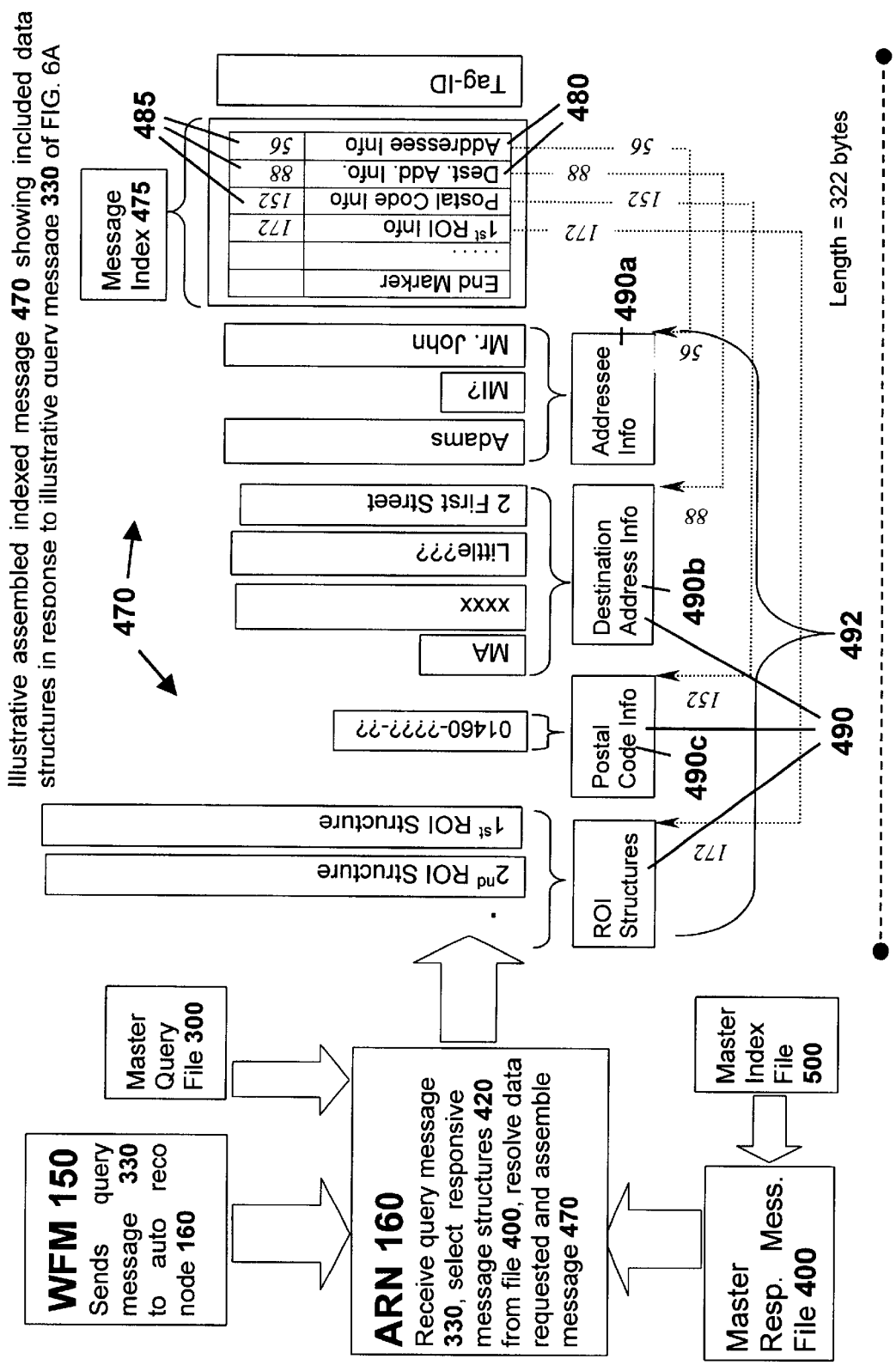

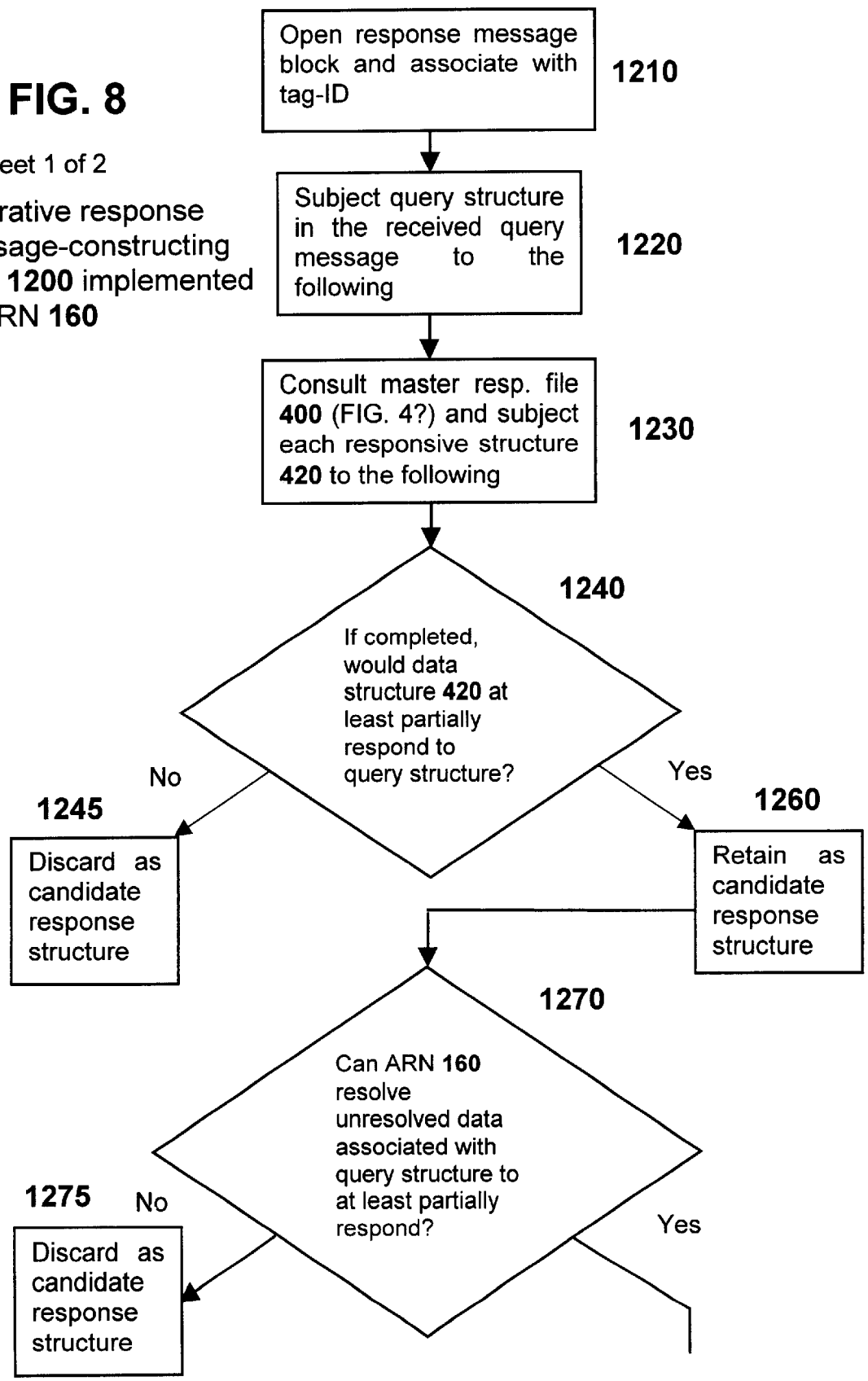

VARIABLE-LENGTH MESSAGE FORMATS AND METHODS OF ASSEMBLING AND COMMUNICATING VARIABLE-LENGTH MESSAGES

BACKGROUND

1. Field

Although not so limited in its utility or scope, implementations of the present invention are particularly well suited for incorporation in automated mail processing systems to facilitate the resolution of address and other images captured from mail pieces moving on a transport system, for example. Alternative implementations may be more broadly applied in other applications requiring the exchange of data over a computer network and are particularly advantageous in bandwidth constrained environments.

2. Brief Description of Related Art and an Applicable Environment

During the processing of mail pieces, capture images of mail pieces (e.g., envelopes) are resolved by postal address interpretation apparatus. The captured images are stored in computer memory and, typically, distributed through a network to a pool of distributed computers and people to determine the intended destination addresses on the corresponding mail pieces. Presently, typical postal address interpretation apparatus employ fixed length, structured messages during this process. Due to variations in the types and sizes of images and attributes associated with the images, space within messages is frequently wasted. A major constraint in automated address interpretation apparatus is the capacity of the network to handle messages. For instance, a major problem lies not so much in the computing capacity of the pooled computers associated with the network— limitations in computing capacity can be compensated for by adding more computers to the network—but in the transmission of messages to and from the various computers in the network. In other words, the speed with which the network can process images and image attributes is very much dependent on the speed with which task requests and results can be exchanged through the network communications links between a workflow manager and the network's interpreting computers, for instance. The transmission of wasted space over the network reduces the overall capacity of the network to process useful information.

Accordingly, there exists a need for a system of structuring messages in a manner that reduces the amount of wasted space transmitted through a computer network.

SUMMARY

According to a general set of implementations, alternative methods of assembling messages for communication over a computer network include providing message-assembling apparatus adapted to assemble a data message. A master message-structure file accessible to the message-assembling apparatus is also provided. The master message-structure file includes a plurality of predefined data structures each of which data structures includes at least one of (i) a single data field and (ii) a set of logically related data fields. Each predefined data structure of a predetermined set of data structures is selectable for inclusion within an assembled message independent of the other data structures within the set of data structures. In assembling a message, at least one data structure is selected from the master message-structure file for inclusion in the assembled message. Data structures are selected for inclusion in a particular message based on a set of predetermined criteria. For instance, in the context of mail piece image processing, data structures are selected on the basis of whether their inclusion is necessary or useful to some present or subsequent operation in the processing of an image.

In a typical version, data structures selected from a master message-structure file are included in a main body of an assembled message. Moreover, an index is associated with the assembled message, the index including at least one index reference indicative of the data content of at least one data structure in the associated main body. In alternative variations resulting in indexed messages, each data structure within the assembled message resides at an identifiable location within the message and the assembled message includes offset references that direct message-reading apparatus from index references to associated data structures.

As will be appreciated, implementations related to the processing of mail piece images can include multiple message-assembling and message-reading apparatus. Moreover, such systems may involve the use of more than one master message-structure file. For example, a workflow manager assigns mail piece image resolution tasks to one or more automatic recognition nodes. At various points in the communication between the workflow manager and an automatic recognition node, the workflow manager and automatic recognition node alternatively function as message-assembling and sending apparatus and message-receiving and reading apparatus. That is, an automatic recognition node receives and reads a message assembled by a workflow manager and, in responding to the workflow manager, assembles a response message that is communicated to and read by the workflow manager. In various implementations, a workflow manager accesses a master query file including query data structures from which the workflow manager selects candidate query data structures for inclusion in a an assembled query message. In some variations, the automatic recognition node accesses a master response-message file including responsive data structures from which the automatic recognition node selects candidate responsive data structures for inclusion in an assembled response message. In reading a query message and assembling a response message, an automatic recognition node acts, in alternative aspects, as query message-reading apparatus and response message-assembling apparatus.

In practice, query data structures and responsive data structures may reside in the same file, which file may alternately be referred to as a master query file and a master response-message file, for example. Alternatively, query data structures and responsive data structures may reside in different files. Regardless of the particular manner of providing query data structures and responsive data structures, in various implementations, an important aspect is that a first set of predefined query data structures be accessible to query message-assembling apparatus and a second set of responsive data structures be accessible to response message-assembling apparatus.

A discussion of implementations in more specific illustrative environments is now presented. FIG. 1 is a schematic representation of an illustrative environment in which the present invention may be implemented. More specifically, FIG. 1 illustrates a basic data processing architecture associated with the processing of images captured from mail pieces to determine, among other things, the delivery addresses for those mail pieces. Although implementations of the invention have been developed with the objective of increasing mail-processing efficiency, it will be appreciated that the advantages of the invention are broadly implementable in a multitude of data messaging applications unrelated to mail processing. Accordingly, the invention should not be so narrowly construed as to limit its scope to any particular application or field of endeavor. Furthermore, even in the more specific context of "mail processing," terms such as "mail piece;" "mail processing machine," "postal" and "mail facility" should not be interpreted so as to exclude, for example, private parcel delivery services. For instance, implementations of the invention can be applied with equal advantage and operability in parcel delivery systems other than government operated or government supported postal systems.

As shown in FIG. 1, a typical mail processing facility includes a plurality of mail processing machines (MPMs). Each MPM interfaces with a data-processing computer network through an external interface (EI), for example, through which data is transferred from the MPM into the network. Once data are introduced by the MPMs into the network, network traffic becomes an issue. A typical MPM includes mechanics for conveying physical mail pieces passed one or more image acquisition apparatus such as a camera or OCR scanner, for instance. As a mail piece passes an image acquisition apparatus, at least one image of the mail piece is captured with the objective being to capture an image of certain "regions of interest (ROI's)" from the physical mail piece. See FIGS. 2 and 2A. The ROI's may include such things as the destination address field, the return address, the affixed postage and the unique identification mark that identifies the mail piece, such as a bar code, for example. ROI-locating information is typically expressed in terms of two diametrically opposed points of the four points defining a rectangle around an area in a Cartesian plane. For instance, as long as it is predetermined that a shape to be defined is a rectangle, then one upper and one lower point from opposite sides of the rectangle are sufficient to define the rectangle. Accordingly, ROI-locating information is expressed and provided in terms of the lower left point and upper right point or the upper left point and lower right point.

Once an image is captured from a mail piece, the image is stored in a data storage device and associated with a computer memory record of a unique identification mark assigned to the mail piece to which it corresponds. A physical rendition of the unique identification mark is affixed (e.g., sprayed in ink) on the physical mail piece for subsequent re-association with the stored computer data corresponding to the mail piece.

As shown in FIG. 1, a work flow manager WFM distributes image data and associated attributes to a plurality of "automatic recognition nodes" $ARN_1$ through $ARN_n$ for interpretation (e.g., image resolution to determine, for example, aspects of a delivery address). In one aspect, address image interpretation involves reducing image data into a form that is usable by a computer to render sorting instructions to automated mail-sorting machinery. For example, a stored image may be resolved to an alphanumeric character string or bit stream. In various implementations, each automatic recognition node ARN is a computer communicatively linked to the computer network as a whole. Each automatic recognition node ARN utilizes address interpretation algorithms, for instance, to resolve the address images transmitted to it for interpretation (a.k.a. automatic recognition).

In one aspect, when an automatic recognition node is unable to interpret an image or other data, it sends a message so indicating back to the workflow manager. The workflow manager then transmits the unresolved data to a manual data entry (MDE) workstation for human assistance in the interpretation thereof. As address information and other data relative to a mail piece are resolved, by either automatic recognition or human interpretation, the resolved information is stored in computer memory in association with the computer memory record of a unique identification mark corresponding to the physical mail piece to which the resolved information relates. It is known that "computer memory" may include primary data storage devices such as RAM or hard drives, or secondary data storage devices such as magnetic disk, magnetic tape, CD, etc., by way of non-limiting example.

Fundamentally, the data exchanged through the computer network to and from various components thereof are in the form of "messages." These messages are comprised of certain definable structures. As previously mentioned, it is not so much computing capacity (e.g., at the automatic recognition nodes) that presents severe limitations on the amount of data that the network as a whole can process per unit time, but the communications links over which the data is transmitted. The time required to input and output messages into and out of the automatic recognition node(s), for example, is also a point of concern. In recognition of these facts, the invention focuses on increasing the amount of useful and necessary data that can be transmitted over a link of given capacity by formatting messages in a way that limits the amount of "wasted space" transmitted through a network. Accordingly, a principal advantage of the present invention is that it increases the task-performing capacity of a data-processing network.

Various implementations of the invention provide the advantage of increasing the efficiency with which relevant address information and other attributes are processed in an automated mail-processing network.

Accounting for much of the wasted space transmitted over current postal address interpretation networks is the fact that messages are typically of fixed length without regard for the amount of space actually required in connection with each message relating to a mail piece, for example. By using fixed length, structured messages, current systems simply accept the waste of space as a design constraint. Even in systems that facilitate variable-length messages, information within a message is sequentially accessed in order to retrieve relevant information. Implementations of the present invention seek to optimize the exchange of image-attribute and other information by encoding the messages to be of variable length and minimizing wasted space. In various implementations, the tags also facilitate configuration management of the control software by allowing dynamic addition of new attributes. In one aspect, a key factor in implementing the invention involves dividing a data stream into structures, each structure containing a data field or logically associated data fields, and "indexing" the structures. The segmenting of a data stream into structures itself is not new. However, in current systems, structures relating to a mail piece, for example, are typically sent over the network without regard for whether they are "empty" or whether the information they contain is required in the sorting and processing of the mail piece. By indexing and tagging structured segments within a message relating to a mail piece, selected portions of the message can be sent over the network as required and accessed randomly when needed.

Various aspects implement a scheme of indexing messages that are communicated between a work flow manager and an automatic recognition node. In alternative implementations, the index itself is in the form of one or more message structures and is included as part of an overall message. The index includes a set of index references, each of which index references contains sufficient information to indicate the contents of a more complete body of offset information with which it is associated and which offset information is also included in a "main body" of the message. One significant advantage of indexing as generally described is that it obviates the need for a workflow manager or automatic recognition node, for example, to sequentially process every structure within a message in order to access relevant information. The index section identifies in "shorthand" what sections are in the main body of the message with which the index is associated. The work flow manager or automatic recognition node reads the index and selects entries included therein for which processing of the corresponding more detailed offset information is or may be necessary or useful.

FIG. 3 depicts an illustrative data stream relating to a mail piece and including data representative of that which may be required to process a mail piece. In the figure, the different-length boxes are representative of the fact that the amount of data associated with the various items of information typically differs. As previously mentioned, a workflow manager sends certain data, and queries concerning that data, to an automatic recognition node and receives resolved data back from the automatic recognition node. For instance, the workflow manager sends an image and work instructions to an automatic recognition node. On the return side, the workflow manager receives results from the various automatic recognition nodes to which it assigns tasks. The boxes of FIG. 3 represent various fields for which a workflow manager requests completion by an automatic recognition node. In response, an automatic recognition node operates on and interprets an image in an effort to complete the fields in accordance with the instructions received from the workflow manager. In a typical system of the current art, what is requested and what is returned by and to the workflow manager is fixed. For instance, if the workflow manager of a current system sends queries for the completion of the information in the fields of FIG. 3 for one mail piece, it does so for all mail pieces in a rigid manner, regardless of need. Further compounding the problem of sending useless information over the network is the fact that the automatic recognition node sends the entire message, with all its fields, to the workflow manager. To the extent that the automatic recognition node is able to complete certain fields, the workflow manager has received useful information. However, the sending to the workflow manager of unfilled fields represents useless data going over the network. Still further waste in the allocation of resources is incurred by inputting and outputting the useless data.

The problem of fixed and serially accessible message structures can be crudely conceptualized by analogy to a railroad system. Consider a set of railroad tracks (the network) that connects point A with a point B (e.g., workflow manager and an automatic recognition node). The railroad tracks can accommodate only X number of train cars (data fields) per day, regardless of whether the cars are full or not. Empty train cars (fields) are sent to point B for loading with different types of freight (data). An empty car (field) sent to point B (automatic recognition node) is essentially a request that that car (data field) be filled and returned to point A (the workflow manager). A fixed train (message) structure might dictate that each train is 50 cars in length. If X=500, then only 10 trains can use the tracks per day. However, if fewer than 50 cars are required to transport all of the goods (data) necessary for a particular train, then sending 50 cars is wasteful of the allotted car quota. Moreover, in a fixed length system, if the request corresponding to a particular car cannot be filled, the empty car is sent back to point A with the remainder of the train.

As applied to the railroad analogy, implementations of the invention seek to identify which type and how many cars (data requests) are required for each train (message) so that the number of empty cars sent to point B (an automatic recognition node) is limited to a number more closely representative of the number actually required. Furthermore, if the order for a particular car cannot be filled at point B, that car is detached from the train, as opposed to being sent back empty over the tracks to point A. The non-receipt of that car is a signal to point A that the order (request for data) could not be filled.

As previously stated, current systems access data within a message sequentially in searching for information required at any given point in time in the process. Further considering the railroad analogy, this can be conceptualized as a rail yard foreman instructing his crew to look for a particular crate containing hardware, for example, on the train. In response, the crew searches the first car and continues searching cars sequentially until it finds the hardware crate. A substantial amount of time and manpower is wasted if the hardware crate turns up in the forty-first car. The indexing aspect can be analogized to providing the rail yard foreman with a manifest of the train's contents and the location of specific contents. In this instance, the foreman reads the manifest and instructs his crew to retrieve the hardware crate from the forty-first car. In response, the crew proceeds to the forty-first car and searches the single car until it finds the crate. The manifest facilitates random (non-sequential) searching of cars in order to expedite results. In analogous fashion, the index associated with a message facilitates non-sequential accessing of information within the main body of the message.

In one implementation, a method of sending messages over a computer network includes providing a workflow manager and at least one automatic recognition node. The work flow manager and the at least one automatic recognition node are communicatively linked for the exchange of messages over a computer network. Each automatic recognition node is adapted to interpret raw (unresolved) input data in response to queries received from the work flow manager.

In one aspect, a master query file containing a plurality of coded queries is provided. The queries relate to a body of potentially ascertainable information concerning unresolved input data that the work flow manager may need resolved in order to provide instructions to automated machinery downstream, for instance. In order to ensure that the work flow manager and the automatic recognition node are in agreement as to which codes refer to which messages, the work flow manager and the automatic recognition node have access, for example, to the same master query file or to distinct copies of the same. In this way, query messages can be communicated over the network from the work flow manager to an automatic recognition node in "short hand," for example.

In the specific context of a postal address processing architecture, for example, the unresolved input data may be one or more stored images "lifted" by image-capturing apparatus from a physical mail piece and stored in a mass store. The "raw," unresolved image is stored as a two-dimensional bit plane of pixels, for example. However, before sortation signals can be rendered to automated sorting machinery downstream, portions of the image may need to be resolved to an alphanumeric character string. Once the workflow manager receives an image from a mail processing machine, for example, the workflow manager selects and associates an appropriate set of queries with the image for inclusion in an assembled query message to an automatic recognition node in order to ascertain information about certain "regions of interest." As previously stated, regions of interest are portions of an overall captured image about which the work flow manager requires more information. For instance, an overall image of the front face of an envelope may include three regions of interest: a first ROI including the destination address field; a second ROI including the return address field and a third ROI including the affixed postage. At a particular point in time, the work flow manager may require resolution of information contained in the first region of interest. Accordingly, the workflow manager selects an appropriate set of pre-programmed queries from the master query file for communication to an automatic recognition node. Along with the selected queries, the workflow manager sends information related to the region of interest about which the workflow manager is inquiring. In one implementation, the workflow manager sends the entire image of the front of the envelope along with a set of ROI-locating information. To assist the automatic recognition node in resolving the requested information, the work flow manager sends an ROI structure including an x and y coordinate identifying each of two diametrically opposed points defining a rectangle around the region of interest. In another implementation, the workflow manager sends only the region of interest from within the overall image. The latter implementation typically results in reduced data travelling over the network for any given overall image.

In various implementations, a "master response-message file" is provided that includes subordinate, predefined message structures. Each predefined structure is selectively "severable" from the master message and includes at least a single data field or a set of logically related data fields. Each data field, when completed (filled with resolved data), is at least partially responsive to one or more queries included in the master query file.

An automatic recognition node is adapted to select for severance and communication to the workflow manager a predefined structure according to a set of criteria. The criteria can include, for instance, (i) whether that structure contains at least one field which, if completed, would be responsive to at least one query sent by the work flow manager and (ii) whether the automatic recognition node, in analyzing the unresolved input data associated with a query, is able to resolve sufficient information about the input data to complete at least a portion of a field within that structure. If the automatic recognition node is able to resolve a predetermined amount of data within one or more fields, it selects for severance and inclusion within its assembled response message to the work flow manager the structure or structures to which each such field(s) belong(s).

In various implementations related to postal processing, the master message includes data structures, each of which data structures includes a set of logically related fields relating to a mail piece image, for example. An illustrative structure is designated "address information" and is defined to include a field corresponding to each of (i) a first street-address line; (ii) a second-street address line; (iii) the destination city name and (iv) the destination state name. Another illustrative structure is dedicated to one or more fields for containing resolved postal code information. For instance, in the United States, a "ZIP Code Information"

structure could include a single field with the capacity to accommodate a five-digit ZIP Code+4+2, for a full eleven digit code defining city, sector, sub-sector and delivery sequence. Persons familiar with the relevant art know that the first three digits of a five-digit ZIP Code typically identify a single "inward mail facility." The inward mail facility further distributes mail pieces to cities and towns within its service region, which cities and towns are typically identifiable by the last two digits of the five-digit ZIP Code.

In one aspect, when an automatic recognition node receives unresolved data and a set of queries concerning that unresolved data from a work flow manager, the automatic recognition node consults the master response-message file to identify candidate structures containing data fields, which if partially or fully completed, would at least partially respond to one or more of those queries. The automatic recognition node attempts to resolve the information called for in at least one field of each candidate response data structure. Whether a response structure is ultimately selected for inclusion in an assembled response message to the workflow manager will in various implementations depend upon a predetermined set of parameters. For instance, minimum thresholds would typically be programmed whereby unless the automatic recognition node is able to resolve some minimum of information within some minimum number of fields, perhaps within some maximum allowable time, the corresponding structure would not be communicated to the work flow manager. The non-receipt by the workflow manager of a data structure associated with a response to one or more queries sent from the workflow manager to the automatic recognition node constitutes a signal to the workflow manager that the automatic recognition node was unable to satisfactorily resolve the data associated with that structure. In accordance with programmed instructions, and depending on the reason for the automatic recognition node's failure to respond to a query (e.g., time expired), the work flow manager may again send the same query set to an automatic recognition node for a subsequent attempt at automated resolution. For example, if the required information is not absolutely required until some later point in time, the work flow manager may re-assign the query set to an automatic recognition node at an off-peak operating time when speed is less critical. Alternatively, the work flow manager may send the query set to a manual-data-entry work station and prompt a human being to provide the required information. In still another alternative scenario, the work flow manager may query a human being for some of the required information and then provide the human-resolved information to an automatic recognition node with a second set of queries if the work flow manager determines that the human-provided entries would assist the automatic recognition node. This last illustrative scenario is a simple example of allocating resolution efforts between relatively expensive human personnel and relatively inexpensive computing apparatus. For instance, rather than have a human being enter all missing data, it is advantageous to have a human provide a minimum of carefully selected data that can then be provided to an automatic recognition node to assist with automated resolution of other data.

In another alternative implementation, a workflow manager is capable of communicating temporally separated sets of queries to an automatic recognition node or manual data entry workstation concerning at least one of (i) the same raw input data and (ii) identifiably associated, but different raw input data. The temporally separated sets of queries include at least a first set of queries and a second set of queries. The workflow manager is adapted to identify predefined data structures containing unresolved or resolved information previously communicated to the WFM by, for example, an automatic recognition node or manual data entry workstation in response to the first set of queries that would potentially assist the automatic recognition node to which the second set of queries is communicated. Moreover, the work flow manager is adapted to associate such potentially useful, unresolved or previously-resolved information with the second set of queries and communicate the corresponding structures containing the previously-resolved/unresolved information to the automatic recognition node or MDE workstation to which the second set of queries is communicated.

The aspects in the preceding paragraph are facilitated in various implementations by pre-programming "hints" as to which types of data are potentially useful in resolving other types of information. For instance, a mail processing machine sends a bar code indicative of delivery address to the work flow manager; the work flow manager in turn may send that bar code along with its query set to an automatic recognition node as a hint in resolving other destination address data. In another illustrative example, the work flow manager may request information regarding the value of the postage affixed to the mail piece. In such a case, the work flow manager would not send data relating to address information along with its postage-related query set because such information would not typically assist an automatic recognition node in resolving postage value. However, if the work flow manager already has access to information regarding the weight of the mail piece, sending that information to an automatic recognition node with a query as to whether the affixed postage is sufficient may assist the automatic recognition node in responding.

In various alternative implementations, a method of formatting messages and communicating them over a computer network comprises the steps of:

providing a workflow manager and at least one automatic recognition node, the workflow manager and the automatic recognition node being communicatively linked for the exchange of messages over a computer network, the at least one automatic recognition node being adapted to interpret unresolved input data in response to queries from the work flow manager;

opening a message block (e.g., allocating an area within random access memory for the construction of a message) and associating the message block with a unique identification associated with a physical mail piece and with a stored image of the physical mail piece;

providing a master query file containing a predetermined set of coded queries relating to a body of potentially resolvable information concerning unresolved input data (e.g., a stored mail piece image) about which the work flow manager requires certain resolved information, the work flow manager and the at least one automatic recognition node having access to the same master query file or distinct copies of the same master query file so that the work flow manager and the automatic recognition node are in agreement as to which codes refer to which queries;

consulting the master query file and determining for each query of a predetermined set of queries within the master query file whether the information called for by that query is at least one of (i) required for the further processing of the unresolved data associated with the mail piece and (ii) already resolved;

selecting for inclusion within an assembled query message a query code corresponding to a query, a response to which query is required or useful for further processing of unresolved data associated with the mail piece and for which the data called for by that query has not already been resolved;

communicating an assembled query message including unresolved data, a set of selected query codes and the associated unique identification from the work flow manager to an automatic recognition node;

providing a master message file including a plurality of predefined data structures, each data structure including at least one of (i) a single data field and (ii) a set of logically related data fields, each data field, when completed, being at least partially responsive to at least one query included in the master query file, each predefined structure in the master message being selectively severable from the master message (e.g., selectively includeable in a response message independent of other data structures), the automatic recognition node being adapted to select for severance and transmission to the work flow manager a predefined structure in response to a set of criteria including, for example, (i) whether that structure contains at least one data field which, if completed, would be at least partially responsive to at least one query sent by the work flow manager and (ii) whether the automatic recognition node, in analyzing the raw input data associated with a query, is able to resolve sufficient information about the raw input data to complete at least a portion of at least one field within that structure to the satisfaction of a predetermined set of parameters;

selecting for severance and inclusion in an assembled message responsive to the query set structures containing at least one field that is at least partially completed with information resolved by the automatic recognition node that is at least partially responsive to one or more queries in the query set to the satisfaction of the predetermined set of parameters; and communicating the assembled response message to the work flow manager.

The master query file and the master message file discussed in the example immediately above are two examples of the concept of master message-structure files introduced near the beginning of this summary.

Alternative implementations further include the step of providing a master index file comprising an index reference corresponding to each message structure of a selected set of message structures. Variations of these implementations still further include the step of selecting for inclusion within an assembled message an index comprised of selected index references corresponding to structures selected for inclusion in the main body of a message. Alternative implementations include a message index including references that refer to structures and/or fields within structures.

In various aspects, the structuring of data within a master message-structure file renders each structured set of data a candidate for exclusion from the assembled message to be communicated over a network. For example, in various versions, the assembly of a message begins with making a copy of a fixed "template" message (i.e., the master) comprised of structured data and associating the copy with an open message block. Accordingly, in some such aspects, only portions of a master message that may or may not be needed in an assembled message are structured. Stated differently, only those data within a master message that are candidates for exclusion from an assembled message are structured. For example, each message associated with a mail piece requires a unique identification (e.g., tag) so that the message can be re-associated with other data relating to the mail piece and/or with the physical mail piece itself. In those aspects in which tag identification is a necessary constant, there is no reason to structure the tag identification for possible exclusion from a message.

Whether the criteria for inclusion within an assembled message of a structure from a master message file are stated positively or negatively is of no consequence. In one aspect, the non-exclusion of a structure results in its inclusion in an assembled message by default. In another aspect, the exclusion of a structure based on some positive set of criteria results in its non-inclusion in the assembled message. In short, "selection for inclusion" includes non-selection for exclusion.

Implementations of the present method are distinguishable from the use of fixed message formats in that each message is custom constructed. Moreover, various implementations facilitate non-sequential access to information within a message by associating an index with the message, the index including a set of index references each of which associates with an offset data structure within the main body of the message.

BRIEF DESCRIPTION OF THE DRAWINGS

FIG. 5 represents a portion of an illustrative master query file;

FIG. 7B shows an assembled response message; and

DETAILED DESCRIPTION

In an automated mail-sorting process, one or more computers analyze image(s) corresponding to a physical mail piece in order to determine certain information about he mail piece. A non-exhaustive list of examples of such information includes (i) mail class; (ii) stamp value; (iii); destination address, including street, number, city and state; (iv) post office box; (v) postal code (e.g., ZIP Code) information; (vi) inward mail center; (vii) addressee name; (viii) return address; (ix) mail processing machine identification and (x) time sorted. Implementations of the invention are concerned with how information relating to captured images of mail pieces are processed and exchanged among different computer apparatus communicating over a computer network. The examples presented in this detailed description are illustrative only and are not to be construed as limitations upon the scope of the invention.

Figure 4:
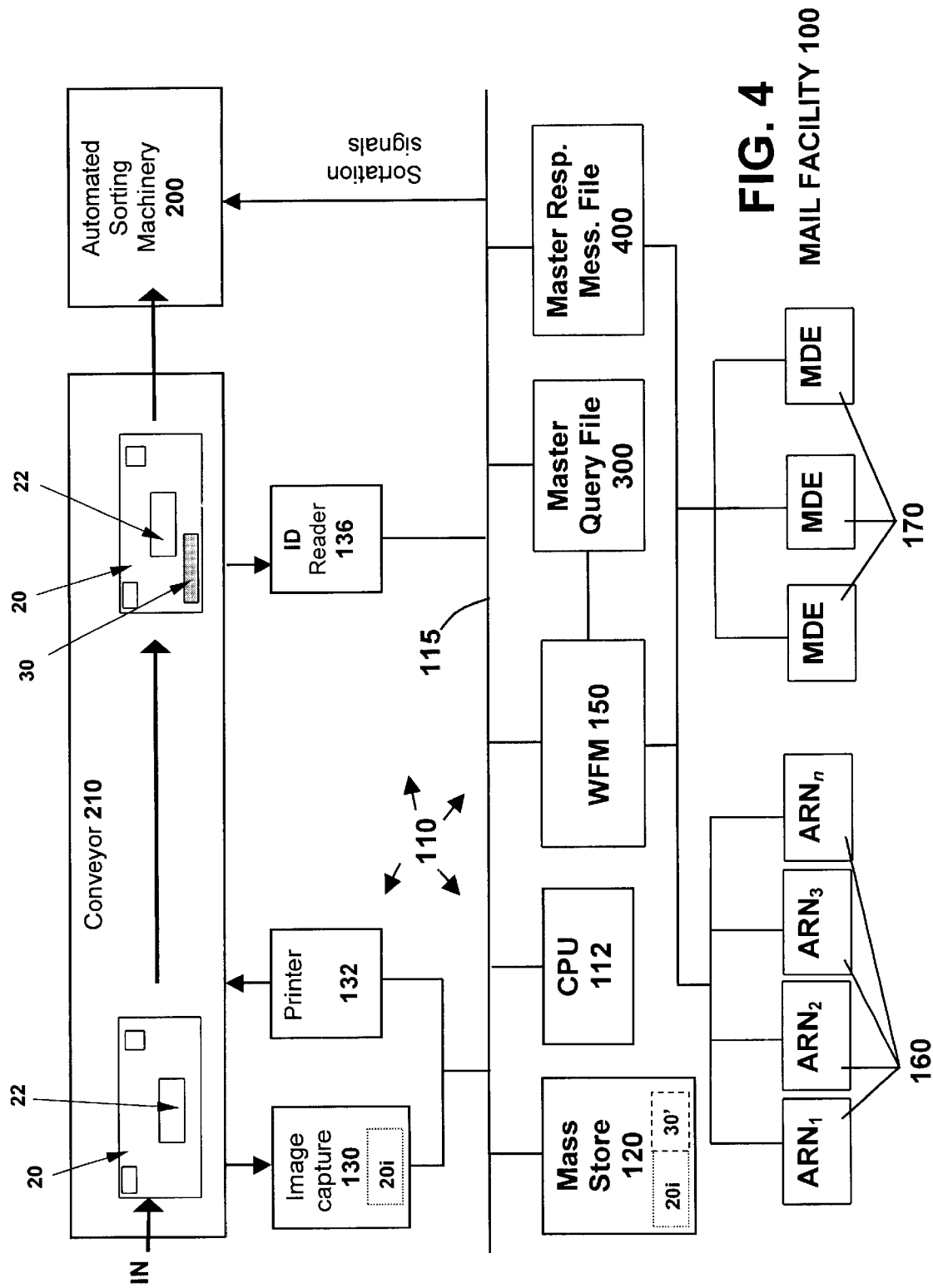
FIG. 4 depicts an illustrative mail facility including a data processing system.

Referring to FIG. 4, a mail piece 20 enters a mail facility 100. The mail facility 100 is equipped with a data-processing system 110. The data-processing system 110 includes a central processing unit (CPU) 112; a bus 115, through which various components are communicatively linked; a data store, such as a mass store 120; image acquisition apparatus 130 (e.g., a camera and/or OCR scanner); a printer 132; an identification-mark reader 136; a work flow manager 150 and one or more automatic recognition nodes 160. Automatic recognition nodes 160 may be assigned various interpreting tasks from the work flow manager 150, including, for instance, the resolution of images associated with a physical mail piece 20 that include destination address, return address and affixed postage. Also communicatively linked to the data-processing system 110 is one or more manual data entry workstations 170, purposes of which were discussed in the summary and are discussed further in this description.

The mail facility 100 also includes automated mail-sorting machinery 200 that sorts mail pieces 20 in response to sortation signals resulting from automated address interpretation, for example.

Figure 1:
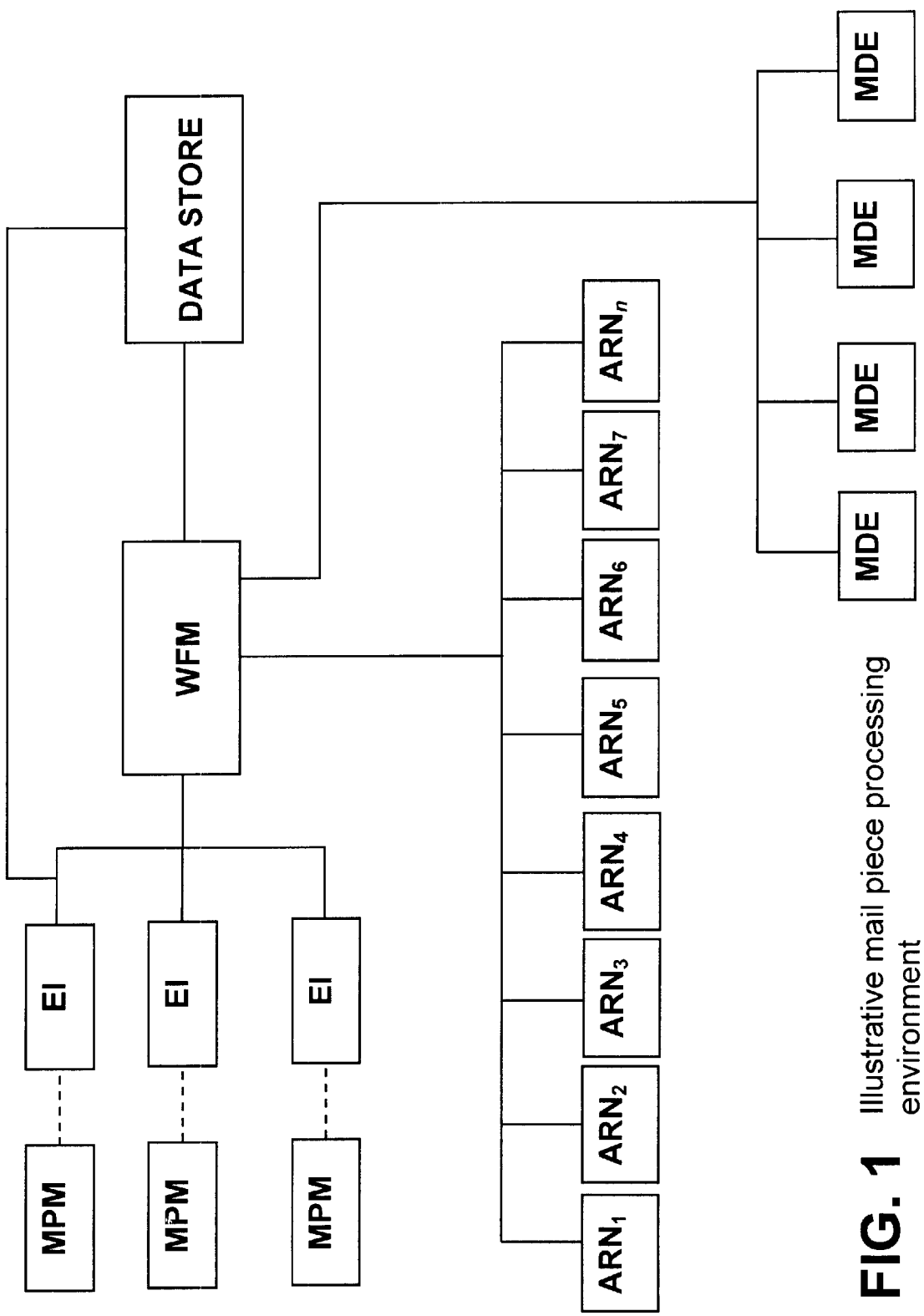
FIG. 1 depicts an illustrative mail-piece-processing environment.
Figure 2:
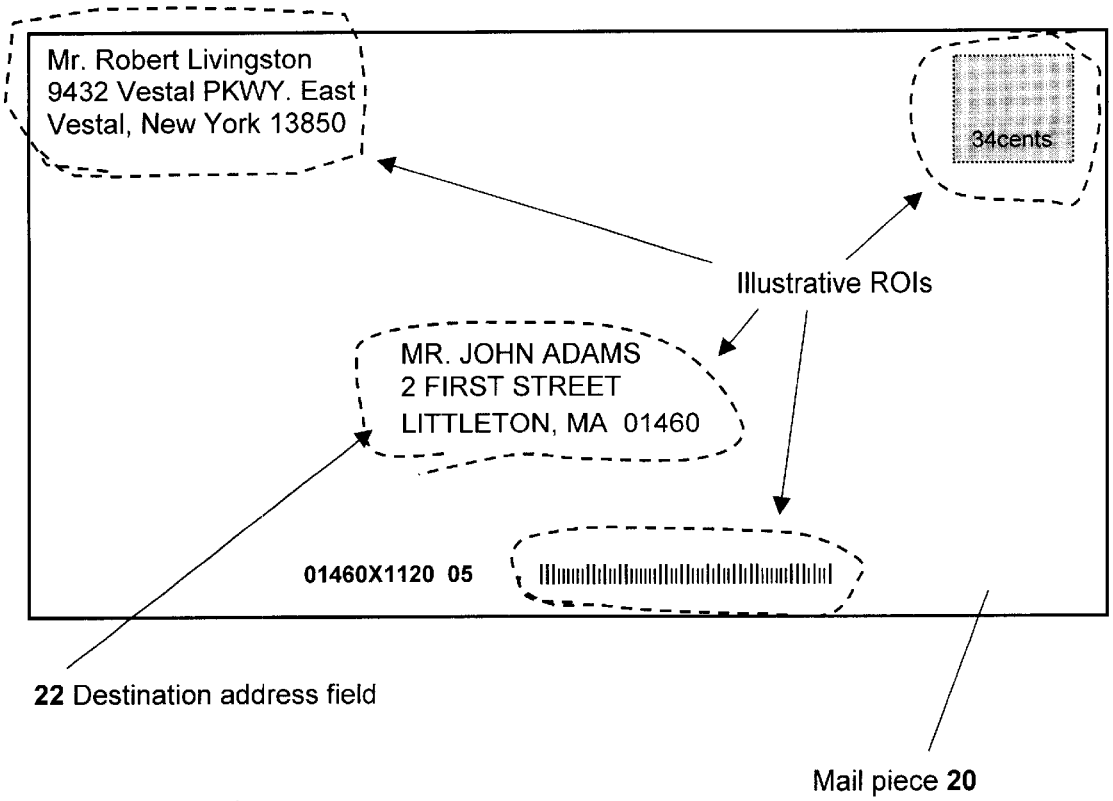
FIGS. 2 and 2A depict the front and rear sides of an illustrative mail piece.
Figure 2A:
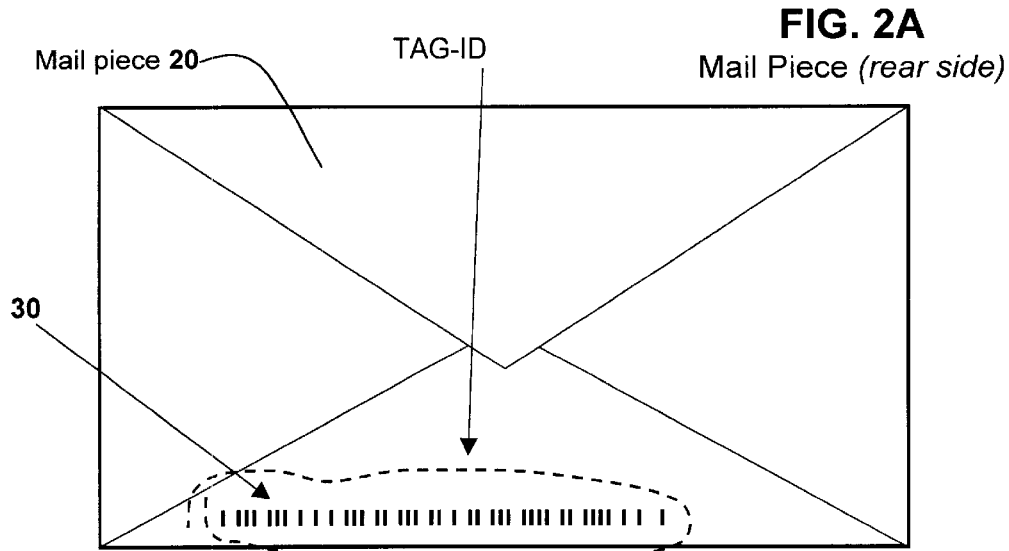
Figure 3:
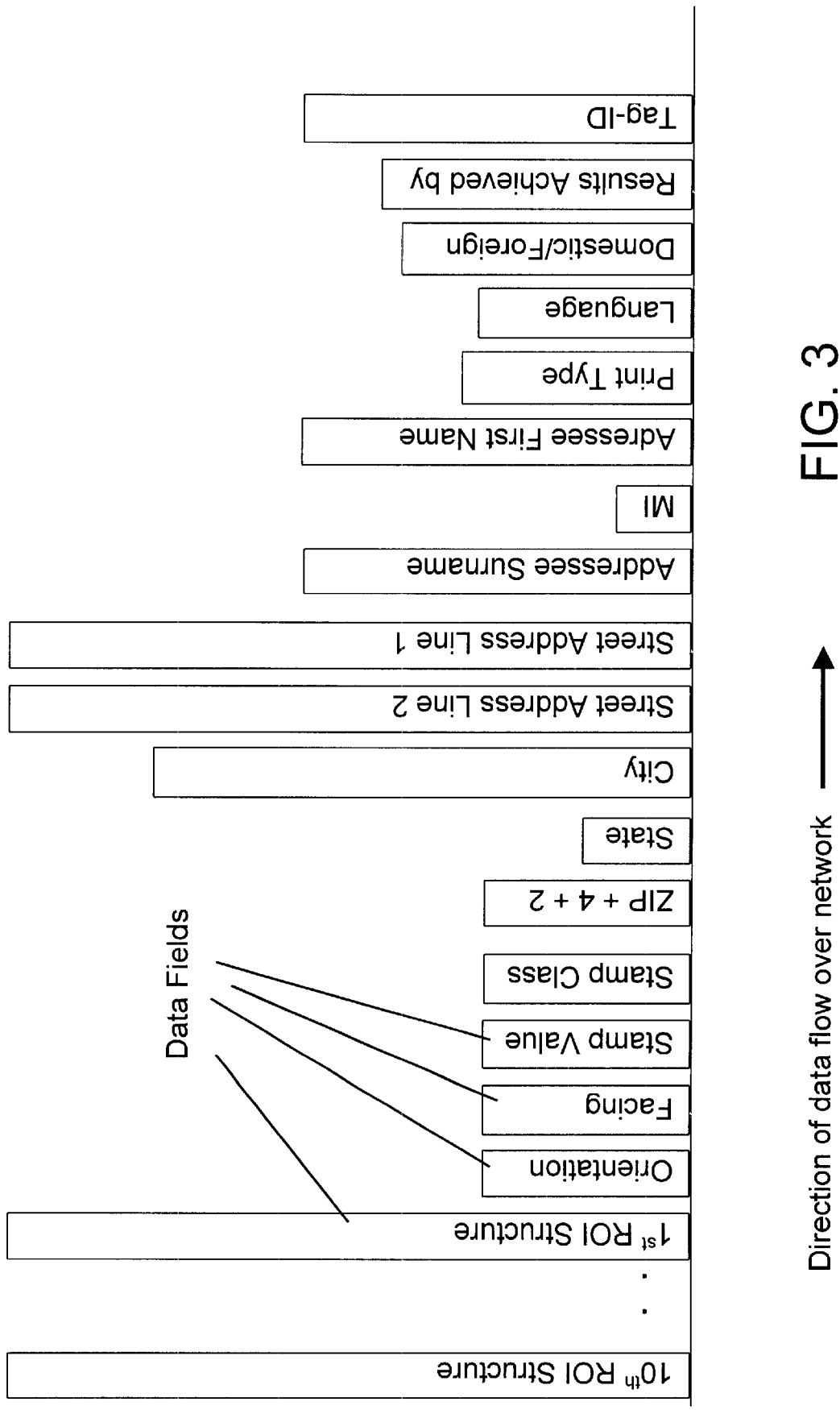
FIG. 3 depicts an illustrative data stream relating to a mail piece.

The mail piece 20 is deposited on a conveyor 210, where it is conveyed passed image-capturing apparatus 130. The image-capturing apparatus 130 captures one or more images 20i of the physical mail piece 20, including its delivery address field 22, and stores each captured image 20i as a two-dimensional bit plane of pixels in the ass store 120, for example. A unique identification mark 30 (i.e., a tag identification) is associated with the captured image(s) 20i and a computer memory record 30' of the unique identification mark 30 is stored in conjunction therewith. Typically, the identification mark 30 comprises a bar code such as that depicted in FIG. 2A, for example. The printer 132 prints the unique identification mark 30 on the physical mail piece 20. The unique identification mark 30 allows captured image(s) 20i corresponding to a particular mail piece 20 to be accessed and, when necessary, re-associated with the mail piece 20. Although FIG. 4 shows the unique identification mark 30 applied to the front side of the mail piece 20, it may be alternatively applied to the rear side of the mail piece 20 as shown in FIG. 2A.

The workflow manager 150 retrieves or otherwise receives unresolved data (e.g., captured images 20i) relating to mail pieces 20 from the mass store 120. The workflow manager 150 selects unresolved data for resolution and communicates that unresolved data and a set of work requests (i.e., queries) concerning that unresolved data to one or more automatic recognition nodes 160. An automatic recognition node 160 is a computer, for example, by which stored mail piece images 20i transmitted to it for interpretation (a.k.a. automatic recognition) are interpreted. Each automatic recognition node 160 executes one or more image resolution algorithms in order to interpret, for example, the destination address in an envelope image 20i. Resolved information is sent back to the workflow manager 150 from each automatic recognition node 160. A primary objective of image resolution with respect to a mail piece 20 is to render sortation signals (i.e., instructions) to automated mail-sorting machinery 200 as to how to physically sort the mail piece 20.

When an automatic recognition node 160 is unable to complete a request for information received from the workflow manager 150, the request may be sent by the workflow manager 150 to any of a set of workstations 170 where a human being provided with certain information about the corresponding mail piece 20 (e.g., an image 20i) attempts to provide the requested information through manual data entry.

In various implementations, the workflow manager 150 consults a "master query file" 300 that includes a predetermined set of queries 310 representative of a body of information concerning a mail piece 20 that could be needed by the workflow manager 150 or provided by an automatic recognition node 160. The workflow manager 150 and each automatic recognition node 160 have access to the master query file 300 (or copies thereof) so that, for example, a coded query 310 sent from the workflow manager 150 is the same when referenced by the automatic recognition node 160 receiving the work request.

FIG. 5 depicts an illustrative portion of a master query file 300. The particular example of FIG. 5 illustrates coded queries 310, with each query 310 having a code 312 (e.g., a number) associated therewith. The queries 310 may alternatively be grouped in blocks of related queries 310 included in data structures (e.g., query structures 315) or each query 310 may be structured so that each query 310 can be sent independently of other queries 310. The example of FIG. 5 includes group and individually structured queries 310. For instance, queries 310 identified as numbers 16 through 23 are each structured individually, while the $27^{th}$ and $28^{th}$ queries 310 are grouped as a single data structure 315 and queries 31 through 33 are grouped in a single data structure 315, as indicated by the brackets.

In various implementations, the data structures 315 included in a master query file 300 are selectively severable from the master query file 300. That is, data structures 315 can be selected for inclusion in an assembled query message independent of other data structures 315 in the master query file 300 in the general manner severability and selective inclusion was discussed previously in the summary.

In arriving at which queries 310 to send to an automatic recognition node 160 in an assembled query message, for example, the workflow manager 150 in various implementations runs sequentially through a selected set of candidate queries 310 in the master query file 300 and subjects each to a set of inclusion and/or elimination criteria. The "selected set" may, in various implementations, be every query 310 in the master query file 300. In alternative implementations, the selected set of candidate queries 310 may include fewer than all the queries 310 in the master file 300. For instance, certain queries 310 may be pre-associated with certain types of images 20i and/or regions of interest within an image 20i. As an example, the $1^{st}$ ROI shown in FIG. 2 includes destination address image information. Once the image type has been determined, only a certain set of queries 310 would pertain. Therefore, in various implementations, certain queries 310 within the master message file 300 would not even be candidates with respect to certain image and/or ROI data.

Figure 5A:
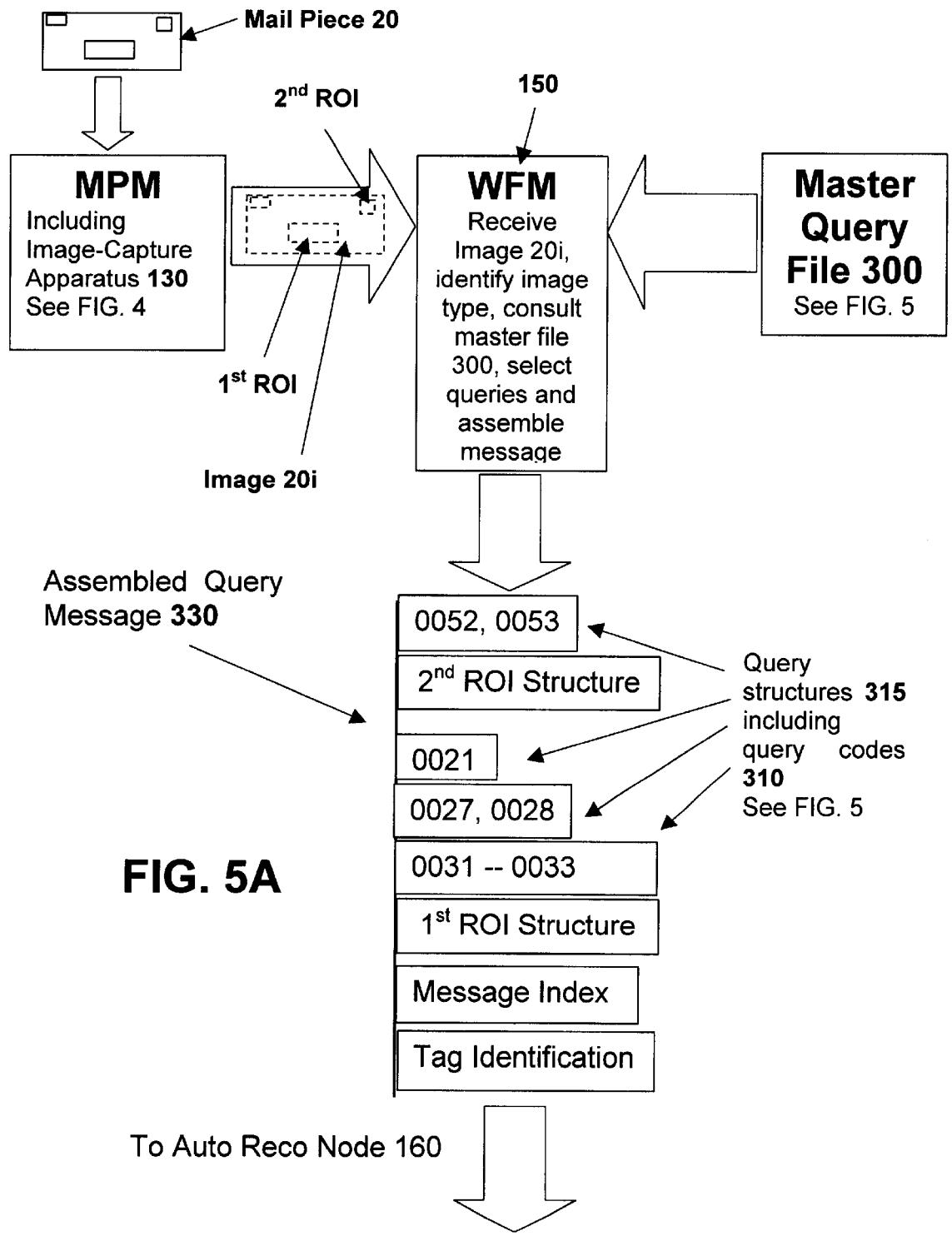
FIG. 5A schematically represents the assembly of a query message.

FIG. 5A schematically depicts the assembly of an illustrative query message 330 by a workflow manager 150 following the receipt of certain image 20i and/or ROI data with respect to the mail piece 20. For the purposes of explanation, assume the mail piece 20 in FIG. 5A is the same as that shown in FIG. 2. In this particular example, the regions of interest with respect to which the workflow manager 150 requires resolved information are the $1^{st}$ ROI and the $2^{nd}$ ROI, which correspond to the destination address and affixed postage, respectively. Accordingly, the workflow manager 150 consults the master query file 300 and selects a set of structured queries 310 from the master query file 300 aimed at obtaining a predetermined set of resolved information about the $1^{st}$ and $2^{nd}$ ROI's. For example, as shown in the assembled query message 330 of FIG. 5A, the workflow manager 150 has assembled and communicated a message to an automatic recognition node 160. The assembled message 330 includes a $1^{st}$ ROI structure containing, for example, unresolved data concerning the $1^{st}$ ROI (e.g., an image or ROI-locating information to assist the ARN 160 in locating the ROI within an image 20i) and a $2^{nd}$ ROI structure containing unresolved data concerning the $2^{nd}$ ROI. Associated with each ROI in the assembled query message 330 are query data structures 315 including query codes 312 corresponding to queries 310 (e.g., task instructions) which, if partially or completely fulfilled, would provide information desired by the workflow manager 150 respecting the ROI structures included in the message 330. In the particular example of FIG. 5A, the assembled query message 330 includes codes 312 corresponding to queries 310 as previously discussed. The queries 310 may be otherwise communicated within the message 330, but coding the queries 310 saves space, as previously discussed.

Figure 6:
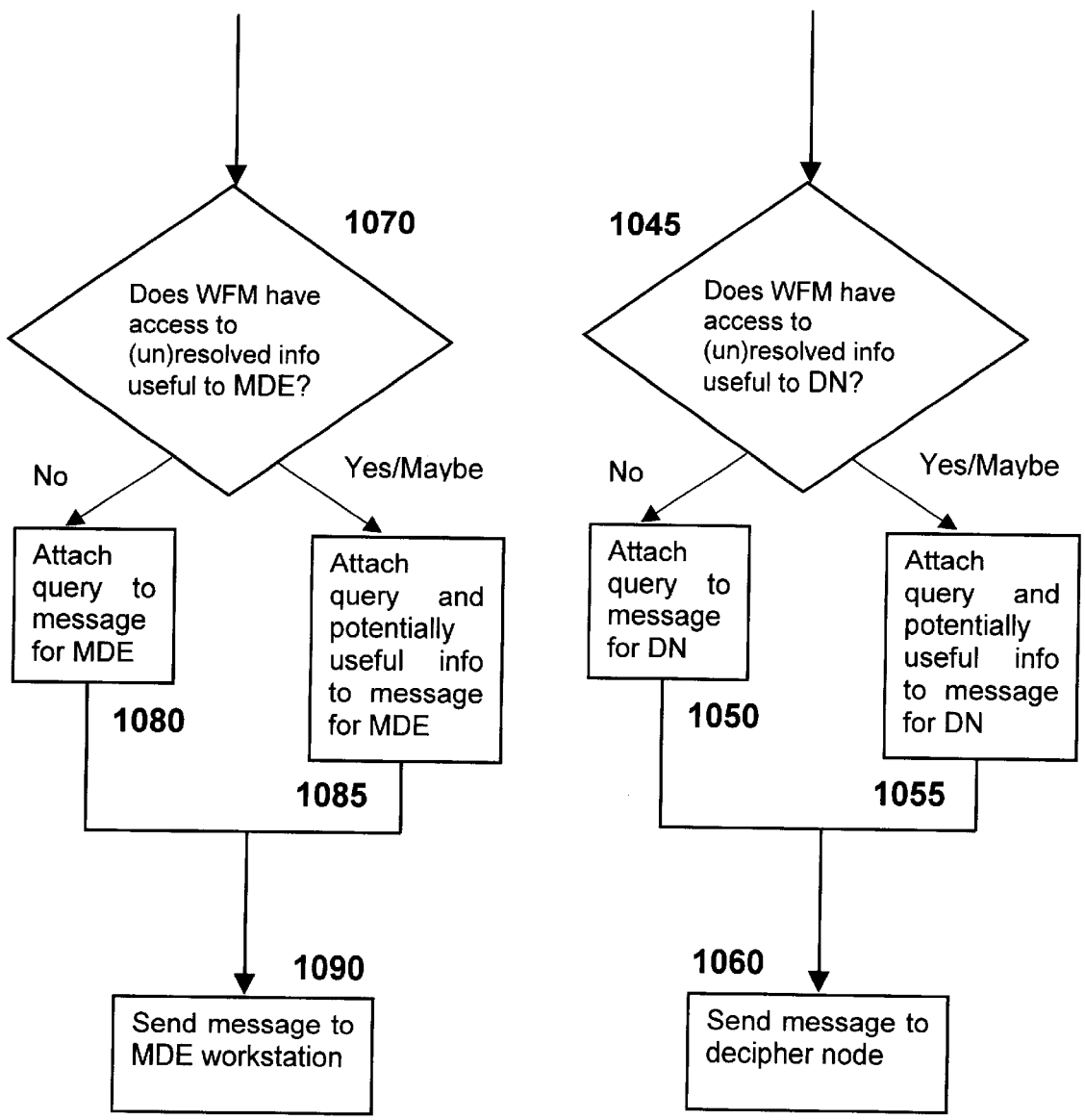
FIG. 6 is a schematic representation of an illustrative query message-constructing logic including inclusion criteria.

FIG. 6 is a flow chart depicting an illustrative message-constructing logic 1000 implemented by the work flow manager 150 in forming a set of queries 310 (e.g., in an assembled query message 330) for an automatic recognition node 160. The message-constructing logic 1000 is executed with respect to a certain set of unresolved data received, retrieved or otherwise accessed by the workflow manager 150, for example. A message block is opened at step 1010. At step 1020, the master query file 300 is consulted and each query structure 315 of a selected set of query structures 315 is subjected to the query logic 1000 to determine that structure's inclusion or exclusion in the assembled message 330 based on a predetermined set of query-message inclusion criteria. For instance, at step 1030, the query logic 1000 calls for a decision as to whether the information requested by a query structure 315 (or at least one query 310 within that structure 315) is required or useful with respect to unresolved data to be included in the assembled query message 330. If the information called for by the query structure 315 is not useful or required, then the corresponding query structure 315 is removed from consideration as a candidate for inclusion. If useful or required information is called for by the query structure 315, then the query structure 315 is retained as candidate for inclusion. It is appropriate to observe that if at least one query 310 within a query structure 315 including two or more queries 310 would, if standing alone, be retained as a candidate for inclusion, then the entire associated query structure 315 is retained, even if another query 310 within that query structure 315 would not have been retained if it stood alone. In other words, a query 310 that would be eliminated as a candidate for inclusion but for its structured association with an included query 310 is nonetheless included by association with an included query 310. Therefore, the inclusion within a query structure 315 of at least one required or useful candidate query 310 results in the inclusion of the whole corresponding structure 315 within the assembled query message 330. Accordingly, it is advantageous to use care in associating queries 310 within a structure 315 so as to "group" logically related queries 310.

In various implementations, as for example in FIG. 6, the query logic 1000 further includes a decision step 1040 as to whether an automatic recognition node 160 can respond with the information called for by at least one query 310 associated with a query structure 315 not eliminated by step 1030. If a response from a recognition node 160 is possible, then the query structure 315 is retained as a candidate for inclusion within a query message 330 bound for an automatic recognition node 160. If before the workflow manager 150 sends the assembled message 330 to an automatic recognition node 160, it is determined that a response from an automatic recognition node 160 to at least one query 310 within a structure 315 is not possible, then the corresponding structure 315 is removed as a candidate for inclusion in the message 330. Still referring to the decision block at step 1040, with respect to a retained query structure 315, the illustrative implementation of FIG. 6 further includes a decision at step 1045 as to whether the workflow manager 150 has access to any resolved or unresolved data that would potentially assist the automatic recognition node 160 in responding to the retained query structure 315. If the workflow manager 150 does not have access to any such potentially useful information, the query structure 315 is simply associated with the message 330 being assembled at step 1050. If the workflow manager 150 does have access to such potentially useful resolved or unresolved data, such data and the query structure 315 are both associated at step 1055 with the message 330 being assembled for transmission at step 1060 to the automatic recognition node 160.

Referring again to the decision at step 1040, with respect to query structures 315 that are excluded from an assembled message 330 for an automatic recognition node 160, various implementations further include steps for inclusion in a separate assembled message bound for a manual data entry workstation 170. Referring to step 1070, a decision block queries whether a response from a manual data workstation 170 is possible. If not, the query structure 315 is removed from consideration for inclusion in an assembled message. If a response is possible from a manual data entry workstation 170, then the query structure 315 is retained for inclusion in an assembled message for a manual data entry workstation 170.

Referring to the decision at step 1070, in similar fashion to the step 1045, with respect to a retained query structure 315, the illustrative implementation of FIG. 6 further includes a decision at step 1075 as to whether the workflow manager 150 has access to any resolved or unresolved data that would potentially assist personnel at a manual data workstation 170 in responding to a query 310 or queries 310 within the retained query structure 315. If the workflow manager 150 does not have access to any such potentially useful information, the corresponding query structure 315 is simply associated at step 1080 with the message being assembled. If the workflow manager 150 does have access to such potentially useful resolved or unresolved data, such data and the query structure 315 are both associated at step 1085 with the message being assembled for transmission at step 1090 to the manual data entry workstation 170.

Regardless of the particular message-constructing logic implemented, once a query message 330 is assembled, it is communicated to an automatic recognition node 160 or manual data entry workstation 170, for example, as shown in FIG. 4.

Figure 7:
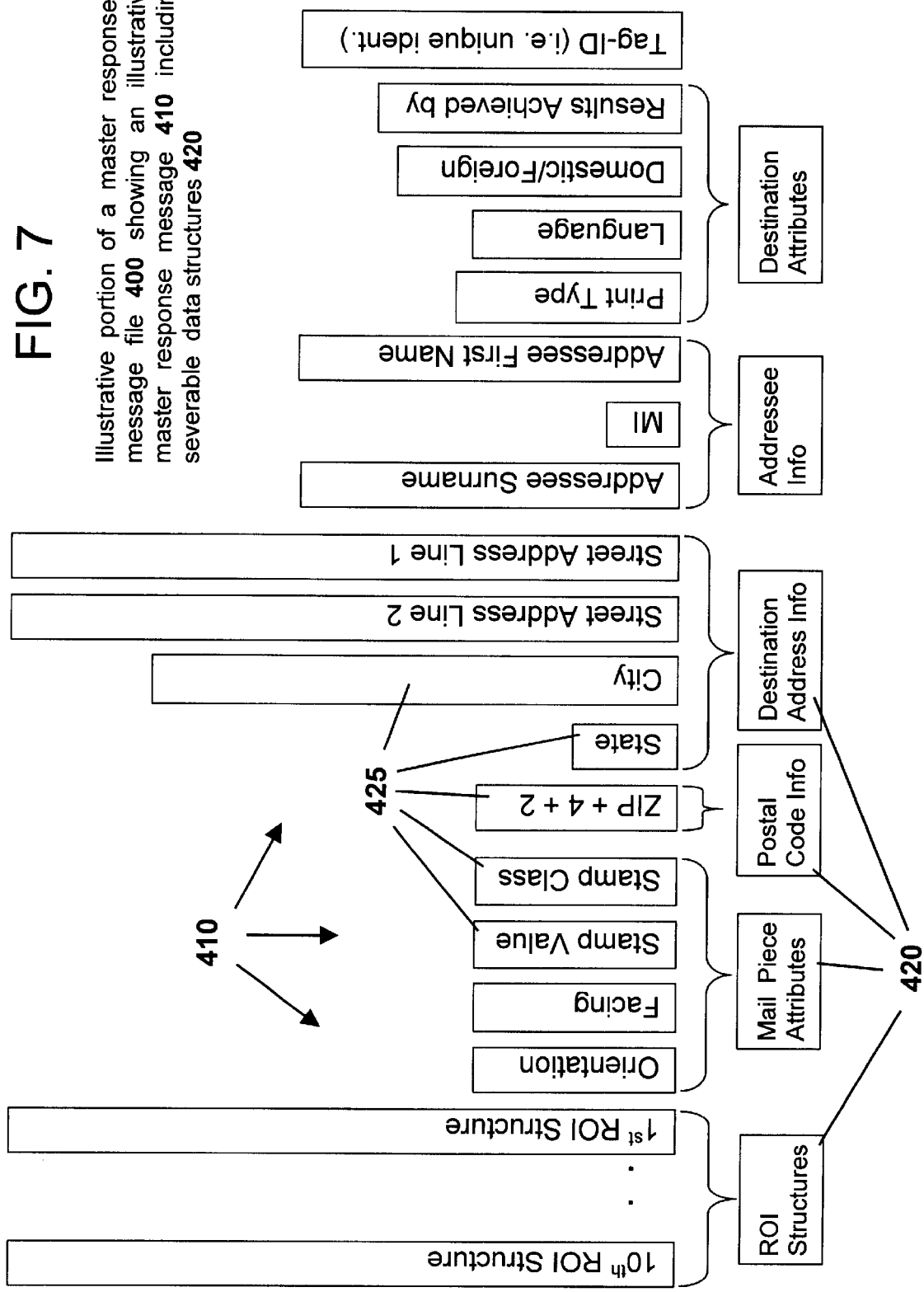
FIG. 7 depicts an illustrative portion of a master message file including a master response message.

Referring to FIGS. 4 and 7, in various implementations, a "master response-message file" 400 is provided. Referring to FIG. 7, an illustrative "master response-message file" 400 includes a portion of an illustrative master response message 410. The illustrative master response message 410 includes subordinate, predefined message structures 420. Each predefined structure 420 is selectively severable—as previously defined, for example—from the master message 410 and includes at least a single data field 425 or a set of logically related data fields 425. Each data field 425, when completed (filled with resolved data), is at least partially responsive to one or more queries 310 included in the master query file 300. In various aspects, for example, a pre-programmed association exists between the field(s) 425 of a response-message structure 420 and one or more queries 310 contained in the master query file 300.

The portion of the master message 410 depicted in FIG. 7 includes six predefined data structures 420 for potential inclusion in a message responsive to a work-flow-manager query message, for example. In constructing a message responsive to a query message, an automatic recognition node 160 will, for instance, run through the data structures 420 contained in the master message 410 as a whole and subject each to a set of criteria for possible inclusion in an assembled response message.

Figure 7A:
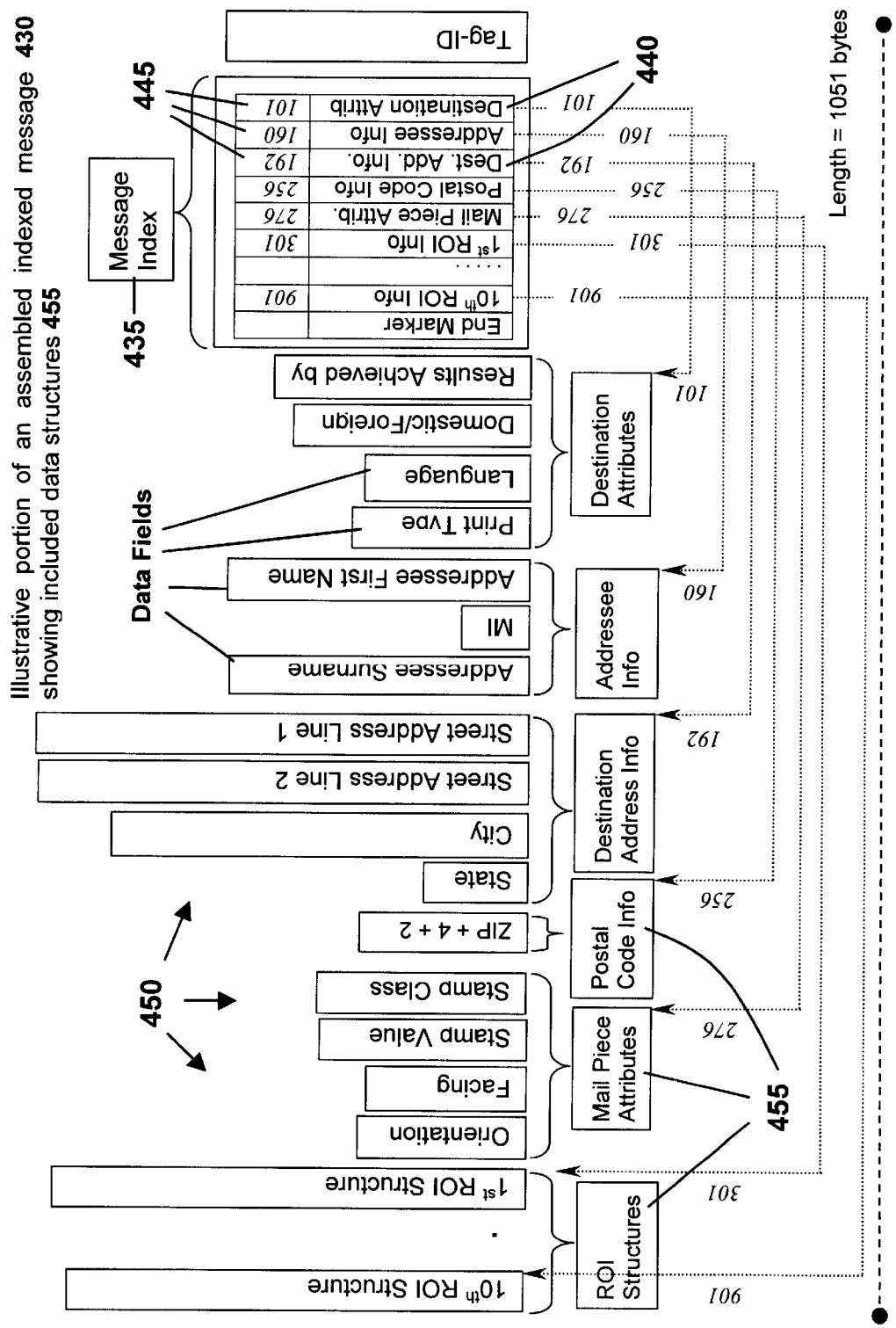
FIG. 7A shows an assembled indexed message.

As previously discussed, certain advantages are realized by indexing the content within messages. FIG. 7A depicts an illustrative, assembled indexed message 430. An arrow indicates the directional flow of data over the network. The indexed message 430 includes a message index 435 that includes a set of index references 440 and offset references 445. The index references 440 are essentially shorthand notations of the types of data that are offset more fully in the main body 450 of the message 430. An offset reference 445 indicates the location within the message 430 of more complete data (e.g., within a data structure 455) associated with an index reference 440. For example, the illustrative message 430 of FIG. 7A is 1051 bytes in length. An offset reference 445 corresponding to each index reference 440 indicates the byte within the message 430 at which the more complete data associated with that index reference 445 begins. For instance, destination address information contained within the message 430 is included within a structure 455 beginning at byte number 192.

Indexing an assembled message and providing offsets enables more rapid and—in various implementations, non-sequential—access to specific information that is needed or desired at particular point in time. For instance, a computer device (e.g., recognition node 160 or workflow manager 150) reads the index within the message sequentially. Once the reading device identifies an index reference associated with desired, more complete information in the body of the message, the corresponding offset reference directs the reading device to the location of the structure and/or data field(s) containing the more complete data. This contrasts with the sequential reading of the entire message in order to locate the desired information. Obviously, the index itself requires space. However, in a typical implementation, the benefits of a custom-assembled message, combined with an index including offset references, yields greater efficiency and shorter message-processing times by reducing overall message size and by enabling ready reference to required data within an already-lean message.

FIG. 7B schematically depicts the assembly of an illustrative indexed message 470 responsive to the illustrative query message 330 of FIG. 5A. Referring again to the query message 330 of FIG. 5A, and the master query file 300 of FIG. 5, the query message 330 includes query codes 312 corresponding to queries 310 seeking resolved data concerning the first five digits of the postal code (0021); destination state and city name (codes 0027 and 0028); addressee surname, middle initial and first name (codes 0031–0033) and affixed postage and mail class (codes 0052 and 0053). In the responsive aspect of FIG. 7B, the automatic recognition node 160 accesses the master query file 300 (e.g., a copy of the query file 300 from which the workflow manager 150 drew the query codes 312), so that the automatic recognition node 160 can decipher the codes 312.

The responsive message 470 of FIG. 7B includes a message index 475. The index 475 includes index references 480. Offset references 485 associate the index references 480 with more complete information included in responsive data structures 490 within the main body 492 of the message 470. Included in the responsive message 470 of FIG. 7B are data structures 490 corresponding to, and adapted to contain, information responsive to the information sought by the queries 310 represented by query codes 312. More specifically, the responsive message 470 includes data structures 490 having data fields 495 to contain addressee information 490a; destination address information 490b and postal code information 490c. To the extent that the automatic recognition node 160 is able to process the $1^{st}$ and $2^{nd}$ ROI-structure information and provide the resolved information requested with respect thereto, the automatic recognition node 160 completes the data fields 495 within the data structures 490a, 490b and 490c. In various aspects, if the automatic recognition 160 cannot provide any information called for by a specific responsive data structure 490, that responsive data structure 490 is not included in the assembled responsive message 470. In the example of FIG. 7B, each of the data structures 490a, 490b and 490c includes at least one data field 495 for which the automatic recognition node 160 was able to provide at least partial resolved data. For instance, the addressee information data structure 490a includes completed first and surname data fields 495, although the automatic recognition node 160 was unable to resolve the middle initial. Similarly, at least some of the data fields 495 within the destination address information data structure 490b are at least partially completed. The postal code data structure 490c is completed to the extent that it includes resolved data requested by the corresponding query 310 (i.e., the query having code number 21 in FIG. 5).

With regard to the index 475 in the example of FIG. 7B, the responsive message 470 includes a "dynamically assembled" index. That is, the index 475 includes index references 480 corresponding only to information (e.g., data structures 490) included in the main body of the message 470. This contrasts, for instance, to the inclusion of a ubiquitously applied rigid index that includes a set of fixedly associated index references selectable as set for association with an assembled message regardless of whether the assembled message actually includes data corresponding to each index reference. In various implementations, a message index is dynamically assembled as main-body data structures 490 are selected for inclusion. For instance, in various aspects, the selection and inclusion of a particular data structure 490 triggers the selection and inclusion of a corresponding structured index reference 480 from a master index file 500 (see FIG. 7B), for example. The master index file 500 may include, for instance, a set of index references in which each index reference of a selected subset of index references is selectable for inclusion in an assembled message independently of the other index references in the subset of index references. To achieve the independent selectability of index references, a master index file 500 may be constructed as a master data structure file including independently selectable index reference structures. A set of index inclusion criteria may require, for instance, the selection for inclusion of a corresponding offset data structure in the main body of a message as a prerequisite to inclusion of an index reference.

Figure 8:
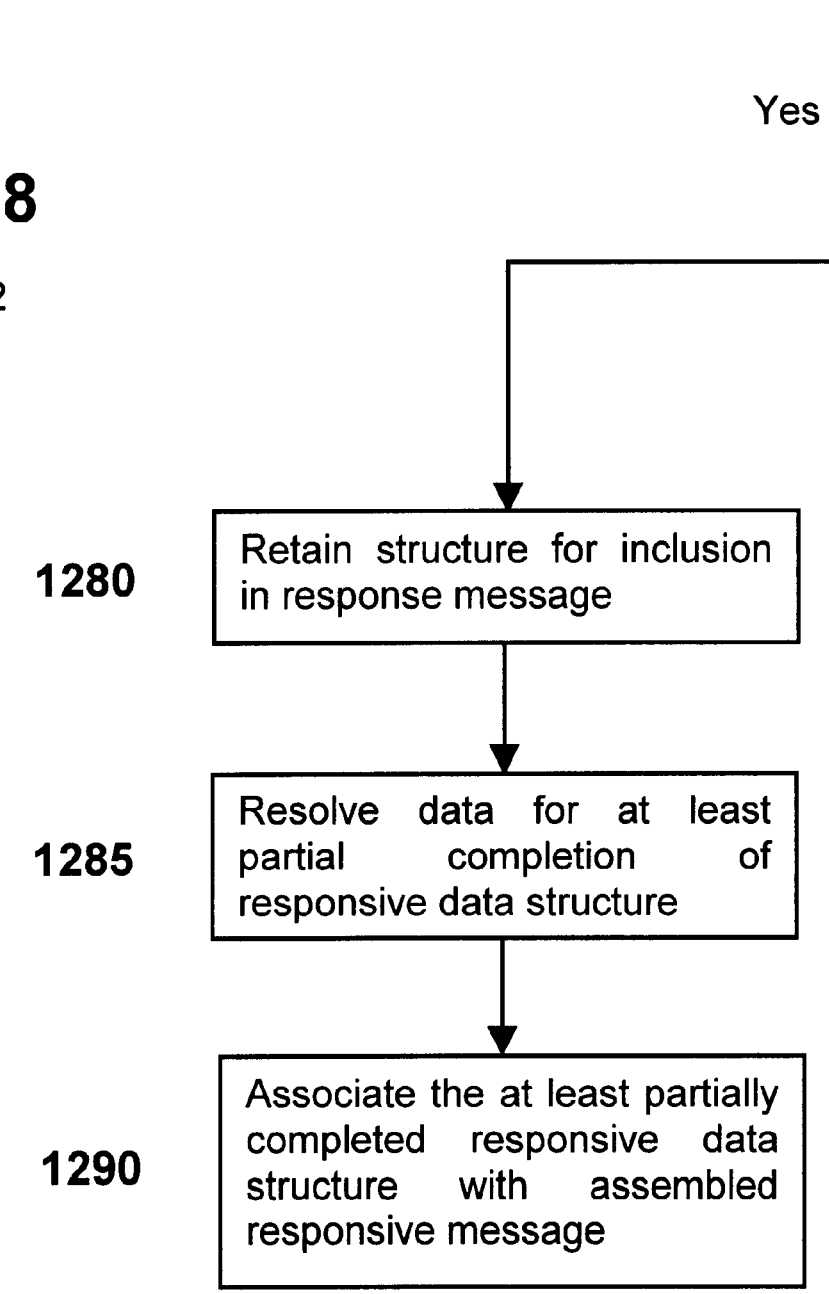
FIG. 8 is a schematic representation of an illustrative response message-constructing logic including inclusion criteria.

FIG. 8 is a flow chart depicting an illustrative message-constructing logic 1200 implemented by an automatic recognition node 160 in forming a responsive message for a workflow manager 150. For the purposes of discussion, the implementation of FIG. 8 is explained relative to the query message 330 of FIG. 5A, the master response-message file 400 of FIG. 7 and the assembled response message of FIG. 7B. In the implementation depicted in FIG. 8, the automatic recognition node 160 "reads" the query message 330. In assembling a responsive message 470, at step 1210 the automatic recognition node 160 opens a response message block and associates it with the tag-identification corresponding to the query message 330 for which the response message 470 is to be assembled. At step 1220, a query structure 315 is selected and the remainder of the response logic beginning at step 1230 is implemented with respect to the selected query structure 315. At step 1230, the master response-message file 400 is consulted and each responsive structure 420 of a selected set of response structures 420 is subjected to predetermined response-message inclusion criteria in order to determine whether that structure 420 will be included in the assembled response message 470. In alternative implementations, the "selected set" of response structures 420 subjected to inclusion criteria may be every response structure 420 in the master response message 410 or a subset of structures 420 selected, for example, on the basis of pre-programmed associations with the query structure 315.

At step 1240, the response logic calls for a decision as to whether the candidate response structure 420 under examination would, if completed (e.g., provided with all the resolved data called for by the data field(s)), at least partially respond to the query structure 315 under consideration. If the candidate response structure 420 would not, even if completed, be responsive to the query structure 315, then the response structure 420 is discarded at step 1245 as a candidate for inclusion in the assembled response message 470. If the candidate response structure 420 would, if completed, be at least partially responsive to the query structure 315, then the candidate response structure 420 is retained for inclusion at step 1260.

With respect to a candidate response structure 420 that is retained at step 1260, step 1270 calls for a decision as to whether the automatic recognition node 160 can resolve any unresolved data associated with the query structure 315 in order to at least partially fulfill the request(s) for resolution associated with the query structure 315. If the automatic recognition node 160 cannot respond, either at all or to the satisfaction of a particular set of parameters, then the candidate response structure 420 is discarded as a candidate for inclusion in the assembled response message 470 at step 1275. A candidate response structure 420 to which the automatic recognition node 160 can at least partially respond as determined at step 1270 is retained for inclusion at step 1280. At step 1285, the automatic recognition node 160 resolves data for at least partial completion of the responsive data structure 420 and, at step 1290, the at least partially completed data structure 420 is associated with the assembled response message 470.

As with the illustrative query message-constructing logic 1000 previously discussed, the response message-constructing logic 1200 represented in FIG. 8, and explained in the paragraphs associated therewith, is entirely illustrative and in no way intended as a limitation on the process, parameters or criteria by which structures 420 are selected for inclusion. Numerous alternative processes, logic steps and/or program instructions suitable for achieving message construction will occur to those of skill in the art and are within the scope and contemplation of the invention.

It will be appreciated by the preceding that implementations of the invention result in messages containing less unnecessary data. Furthermore, various implementations facilitate non-sequential access to information within the body of a message by associating an index and offset references with the message.

The foregoing is considered to be illustrative of the principles of the invention. Furthermore, since modifications and changes will occur to those skilled in the art without departing from the scope and spirit of the invention, it is to be understood that the foregoing does not limit the invention as expressed in the appended claims to the exact construction, implementations and versions shown and described.

What is claimed is:

1. A method of assembling a data message comprising:
   opening a data message block;
   accessing a set of predefined data structures, the set of predefined data structures containing candidate data structures for inclusion in the assembled data message, each candidate data structure being selectable for inclusion in the assembled message independently of other candidate data structures based on predetermined inclusion criteria;
   consulting the predetermined inclusion criteria with respect to each predefined data structure of a selected set of candidate data structures; and
   associating with the data message block each candidate data structure meeting the criteria for inclusion in the assembled message.

2. The method of claim 1 further comprising:
   grouping the selected candidate data structures in a main body of the assembled message; and
   associating a message index with the main body, the index including an index reference corresponding to each main-body data structure of a selected set of main-body data structures, each index reference being indicative of the data content of the main-body data structure to which that index reference corresponds.

3. The method of claim 2 wherein each main-body data structure resides in an identifiable location within the assembled message and the method further comprises associating an offset reference with an index reference, the offset reference being indicative of the location within the main body of a data structure corresponding to the index reference.

4. The method of claim 2 wherein the index is dynamically assembled such that the inclusion of an index reference in the index is dependent upon the inclusion in the main body of a main-body data structure corresponding to that index reference.

5. The method of claim 2 wherein the index is of predetermined content and is associated with the main body irrespective of whether the main body includes a main-body data structure corresponding to each index reference.

6. A method of assembling a data message comprising:
   opening a data message block;
   accessing a set of predefined data structures, the set of predefined data structures containing candidate data structures for inclusion in the assembled data message, each candidate data structure being selectable for inclusion in the assembled data message independently of other candidate data structures based on predetermined inclusion criteria;
   consulting the predetermined inclusion criteria with respect to each predefined data structure of a selected set of candidate data structures;
   associating with the data message block each candidate data structure meeting the criteria for inclusion in the assembled message; and
   associating a message index with the included data structures, the index including an index reference corresponding to each included data structure of a selected set of included data structures, each index reference being indicative of the data content of the included data structure to which that index reference corresponds.

7. The method of claim 6 wherein each included data structure resides in an identifiable location within the assembled message and the method further comprises associating an offset reference with an index reference, the offset reference being indicative of the location within the assembled message of a data structure corresponding to the index reference.

8. The method of claim 7 wherein the index is dynamically assembled such that the inclusion of an index reference in the index is dependent upon the inclusion of a data structure corresponding to that index reference.

9. The method of claim 7 wherein the index is of predetermined content and is associated with the included data structures irrespective of whether there is included among the included data structures a data structure corresponding to each index reference.

10. A system for assembling variable-length data messages, comprising:
    a set of predefined data structures including a plurality of predefined data structures that are selectable for inclusion within an assembled message independently of other data structures within the set;
    a set of inclusion criteria, the inclusion criteria being determinative of whether a data structure from the set of predefined data structures is selected for inclusion in the assembled message; and
    computer apparatus programmed to:
      (a) open a data message block;
      (b) access the set of predefined data structures;
      (c) consult the set of inclusion criteria;
      (d) apply the inclusion criteria to each predefined data structure of a selected set of candidate data structures to determine that data structure's selection for inclusion in the assembled message; and
      (e) associate each data structure selected for inclusion with the data message block.

11. The system of claim 10 further comprising a master set of index references including index references that are selectable for inclusion in the assembled message independently of other index references within the master set, each index reference within the master set corresponding to, and indicating the content of, a predefined data structure within the set of predefined data structures.

12. The system of claim 11 wherein the computer apparatus is further programmed to:
    (a) select for inclusion in the assembled message an index reference corresponding to an included predefined data structure;
    (b) arrange included predefined data structures in a main body of the message;
    (c) arrange included index references in a message index; and
    (d) associate an offset reference with an included index reference, the offset reference being indicative of the location within the message of the predefined data structure corresponding to the index reference.

13. A system for assembling data messages for communication over a computer network, comprising:

a master query-message file containing a plurality of query data structures, each query data structure containing at least one query, each query data structure of a selected set of query data structures being selectable for inclusion in an assembled query message independently of other query data structures;

a programmed set of query-message inclusion criteria, the query-message inclusion criteria being determinative of whether a query data structure is selected for inclusion in the assembled message; and query message-assembling computer apparatus programmed to:
  (a) open a query message block;
  (b) access the master query-message file;
  (c) consult the set of query-message inclusion criteria;
  (d) apply the query-message inclusion criteria to each query data structure of a selected set of candidate query data structures to determine that query data structure's selection for inclusion in the assembled message; and
  (e) associate each query data structure selected for inclusion with the query message block.

14. The system of claim 13 further comprising query message-reading computer apparatus communicatively linked to the query message-assembling computer apparatus, wherein the query message-assembling apparatus is adapted to communicate the assembled query message over the computer network to the message-reading apparatus.

15. The system of claim 14 further comprising:
a master response-message file including a plurality of predefined responsive data structures, each responsive data structure being adapted to contain data that, when provided, render the responsive data structure at least partially responsive to at least one query in the master query-message file, each responsive data structure of a selected set of responsive data structures being selectable for inclusion in an assembled response message independently of other responsive data structures;

a programmed set of response-message inclusion criteria, the response-message inclusion criteria being determinative of whether a responsive data structure is selected for inclusion in the assembled response message; and response message-assembling computer apparatus programmed to:
  (a) receive and read a query message communicated by the query message-assembling computer apparatus;
  (b) open a response message data block;
  (c) access the master response-message file;
  (d) consult the set of response-message inclusion criteria;
  (e) apply the response-message inclusion criteria to each responsive data structure of a selected set of candidate responsive data structures to determine that responsive data structure's selection for inclusion in the assembled response message; and
  (f) associate each responsive data structure selected for inclusion with the response message data block.

16. The system of claim 15 wherein the selected set of candidate responsive data structures includes at least one responsive data structure having a pre-programmed association with at least one query data structure in the query message to which the assembled response message is responsive.

17. The system of claim 15 wherein the response message-assembling computer apparatus is adapted to communicate the assembled response message over the computer network to the query message-assembling computer apparatus.

18. The system of claim 13 wherein the query message-assembling computer apparatus is adapted to receive unresolved input data requiring resolution and the master query-message file includes query data structures seeking resolution of the unresolved input data.

19. The system of claim 18 wherein the unresolved input data include captured mail piece images.

20. The system of claim 15 wherein (i) the query message-assembling computer apparatus is adapted to receive unresolved input data requiring resolution; (ii) the master query-message file includes query data structures seeking resolution of the unresolved input data; (iii) the response message-assembling computer apparatus is an automatic recognition node programmed to implement algorithms adapted to resolve the unresolved input data; and (iv) the master response-message file includes a set of responsive data structures, each responsive data structure of the set including one of (a) a single data field and (b) a set of logically related data fields, each data field being adapted to contain resolved data that, when provided, render the data field at least partially responsive to at least one query data structure seeking resolution of the unresolved input data.

21. The system of claim 20 wherein the unresolved input data include at least one captured mail piece image and the algorithms that the response message-assembling computer apparatus is programmed to implement include image resolution algorithms.

22. The system of claim 15 further including a master index file including at least one of (i) a first set of fixedly associated index references selectable for association as a set with an assembled message and (ii) a second set of index references in which each index reference of a selected subset of index references is selectable for inclusion in an assembled message independently of other index references in the second set of index references, the index references of the first and second sets corresponding to, and indicating the data content of, data structures selectable for inclusion from at least one of (a) the master query-message file and (b) the master response-message file.

23. The system of claim 22 wherein at least one of the query-message assembling computer apparatus and the response message-assembling computer apparatus is adapted to associate with selected data structures in an assembled message at least one of (i) the first set of fixedly associated index references and (ii) a set of included index references selected from the second set of index references.

24. A mail-piece-image data processing system, comprising:
  a data storage device;
  image acquisition apparatus adapted to capture an image of a mail piece and store the captured image as unresolved image data in the data storage device;
  a master query-message file containing a plurality of query data structures, each query data structure containing at least one query relating to a body of potentially resolvable information concerning unresolved input image data, each query data structure of a selected set of query data structures being selectable for inclusion in an assembled query message independently of other query data structures;
  a programmed set of query-message inclusion criteria, the query-message inclusion criteria being determinative of whether a query data structure is selected for inclusion in the assembled message;

query message-assembling computer apparatus programmed to:
(a) open a query message block;
(b) access unresolved image data from the data storage device and associate the unresolved image data with the query message block;
(c) access the master query-message file;
(d) consult the set of query-message inclusion criteria;
(e) apply the query-message inclusion criteria to each query data structure of a selected set of candidate query data structures to determine that query data structure's selection for inclusion in the assembled message; and
(f) associate each query data structure selected for inclusion with the query message block;

a master response-message file including a plurality of predefined responsive data structures adapted to contain resolved mail-piece image data that, when provided, render the data structure at least partially responsive to at least one query in the master query file, each responsive data structure of a selected set of responsive data structures being selectable for inclusion in an assembled response message independently of other responsive data structures;

a programmed set of response-message inclusion criteria, the response-message inclusion criteria being determinative of whether a responsive data structure is selected for inclusion in the assembled response message; and response message-assembling computer apparatus programmed to:
(a) receive and read a query message communicated from the query message-assembling apparatus;
(b) open a response message data block;
(c) access the master response-message file;
(d) consult the set of response-message inclusion criteria;
(e) apply the response-message inclusion criteria to each responsive data structure of a selected set of candidate responsive data structures to determine that responsive data structure's selection for inclusion in the assembled response message; and
(f) associate each responsive data structure selected for inclusion with the response message data block.

25. The mail-piece-image data processing system of claim 24 wherein the unresolved image data are of more than one identifiable type and query data structures are selected for inclusion in an assembled query message at least partially on the basis of a pre-programmed association between selected unresolved image data types and selected query structures.

26. The mail-piece-image data processing system of claim 24 wherein pre-programmed associations exist between at least some of the query data structures in the master query-message file and at least some of the responsive data structures in the master response-message file, and wherein responsive data structures are identified as candidates for potential inclusion in an assembled response message on the basis of a pre-programmed association with at least one query structure included in an assembled query message.

27. An assembled data message comprising:
a main body including a set of predefined data structures selected for inclusion in the assembled message on the basis of predetermined inclusion criteria, each main-body data structure residing in an identifiable location within the assembled message;
a message index including an index reference corresponding to each main-body data structure of a selected set of main-body data structures, each index reference being indicative of the data content of the main-body data structure to which that index reference corresponds; and
an offset reference adapted to indicate to message-reading apparatus the location within the main body of a data structure corresponding to an index reference.

28. The assembled data message of claim 27 wherein each predefined data structure comprises one of (i) a single data field and (ii) a set of logically related data fields.

29. The assembled data message of claim 28 including data fields of variable length.

30. A method of assembling and communicating messages relating to mail-piece image processing over a computer network, the method comprising:
providing a data storage device;
capturing an image of a mail piece and storing the mail piece image as unresolved image data in the data storage device;
providing a master query file containing a plurality of query data structures, each query data structure containing at least one query relating to a body of potentially resolvable information concerning unresolved input image data, each query data structure of a selected set of query data structures being selectable for inclusion in an assembled query message independently of other query data structures on the basis of predetermined query-message inclusion criteria;
providing query message-assembling computer apparatus and response message-assembling computer apparatus, the query message-assembling computer apparatus and the response message-assembling computer apparatus being communicatively linked for the exchange of messages over the computer network and the response message-assembling computer apparatus being adapted to interpret unresolved image data in response to queries from the query message-assembling computer apparatus, the query message-assembling computer apparatus having access to unresolved image data stored in the data storage device and to the master query file and, furthermore, being adapted to associate within an assembled query message unresolved image data relating to a mail piece and a set of query data structures selected for inclusion within the query message on the basis of the predetermined inclusion criteria;
causing the query message-assembling computer apparatus to assemble a query message including unresolved image data and at least one query structure meeting the query-message inclusion criteria; and
causing the query message-assembling computer apparatus to communicate the assembled query message to the response message-assembling computer apparatus.

31. The method of claim 30 further comprising:
causing the response message-assembling computer apparatus to receive the assembled query message;
causing the response message-assembling computer apparatus to read the query message;
providing a master response-message file including a plurality of predefined responsive data structures, each responsive data structure including one of (i) a single data field and (ii) a set of logically related data fields, each data field being adapted to contain resolved data which, when provided, renders the data field at least partially responsive to at least one query in the master query file, each responsive data structure of a selected set of responsive data structures being selectable for inclusion in an assembled response message independently of other responsive data structures on the basis of predetermined response-message inclusion criteria;

causing the response message-assembling computer apparatus to execute a set of image resolution algorithms adapted to resolve the unresolved image data;

causing the response message-assembling computer apparatus to assemble a response message including at least one responsive data structure containing resolved image data; and communicating the assembled response message from the response message-assembling computer apparatus to at least one of (i) the query message-assembling computer apparatus and (ii) a location requested by the query message-assembling computer apparatus.

32. The method of claim 31 wherein the response-message inclusion criteria provide for non-inclusion of a responsive data structure if at least one of the following is true:

(i) the responsive data structure includes no data field that, if completed, would be at least partially responsive to at least one query in the query message; and (ii) the response message-assembling computer apparatus cannot interpret unresolved image data included in the query message in order to complete at least one data field within the responsive data structure one of (a) at all and (b) to the satisfaction of a preprogrammed minimum threshold.

* * * * *